(12) United States Patent
Inaba

(10) Patent No.: US 6,906,979 B2
(45) Date of Patent: Jun. 14, 2005

(54) SEMICONDUCTOR MEMORY DEVICE HAVING BIT LINE KICKER

(75) Inventor: Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 10/271,998

(22) Filed: Oct. 17, 2002

(65) Prior Publication Data
US 2003/0072201 A1 Apr. 17, 2003

(30) Foreign Application Priority Data
Oct. 17, 2001 (JP) ........................................ 2001-319672

(51) Int. Cl.$^7$ ................................................ G11C 8/00
(52) U.S. Cl. ........................ 365/230.03; 365/230.03; 365/203; 365/230.06; 365/230.08; 365/189.06
(58) Field of Search ............................ 365/230.03, 203, 365/230.06, 230.08, 189.06

(56) References Cited

U.S. PATENT DOCUMENTS

| 4,982,367 | A | 1/1991 | Miyatake |
| 5,761,109 | A | 6/1998 | Takashima et al. |
| 5,982,695 | A | 11/1999 | Mukai |
| 6,078,542 | A | 6/2000 | Tomishima |
| 6,246,614 | B1 * | 6/2001 | Ooishi .......................... 365/191 |
| 6,434,049 | B1 * | 8/2002 | Trivedi et al. ............ 365/185.2 |
| 6,452,833 | B2 | 9/2002 | Akita et al. |

FOREIGN PATENT DOCUMENTS

| JP | 63-282993 A | 11/1988 |
| JP | 08-315577 A | 11/1996 |
| JP | 10-302468 A | 11/1998 |
| JP | 2000-011639 A | 1/2000 |
| JP | 2002-050181 A | 2/2002 |

OTHER PUBLICATIONS

Lim, K., et al., "Bit Line Coupling Scheme and Electrical Fuse Circuit for Reliable Operation of High Density DRAM," *2001 Symp. VLSI Circuits Dig. Tech. Papers*, Jun. 2001.

* cited by examiner

*Primary Examiner*—Connie C. Yoha
(74) *Attorney, Agent, or Firm*—Banner & Witcoff, Ltd.

(57) ABSTRACT

A plurality of cell arrays is provided with a plurality of word lines and bit line pairs. A plurality of sense amplifiers is connected so as to each of the plurality of bit line pairs. The plurality of sense amplifiers configures a memory core section together with the plurality of cell arrays. A pair of bit line kicker drive lines is arranged in the vicinity of the plurality of cell arrays, and a pair of bit line kickers is connected between the pair of bit line kicker drive lines and each of the plurality of bit line pairs. In the memory core section, a pair of drivers is arranged so as to correspond to each cell array, and each of the pair of drivers has an output node connected to the pair of bit line kicker drive lines. The pair of drivers drives the pair of bit line kicker drive lines so as to change a potential of one bit line of one of the plurality of bit line pairs via the pair of bit line kickers.

26 Claims, 12 Drawing Sheets

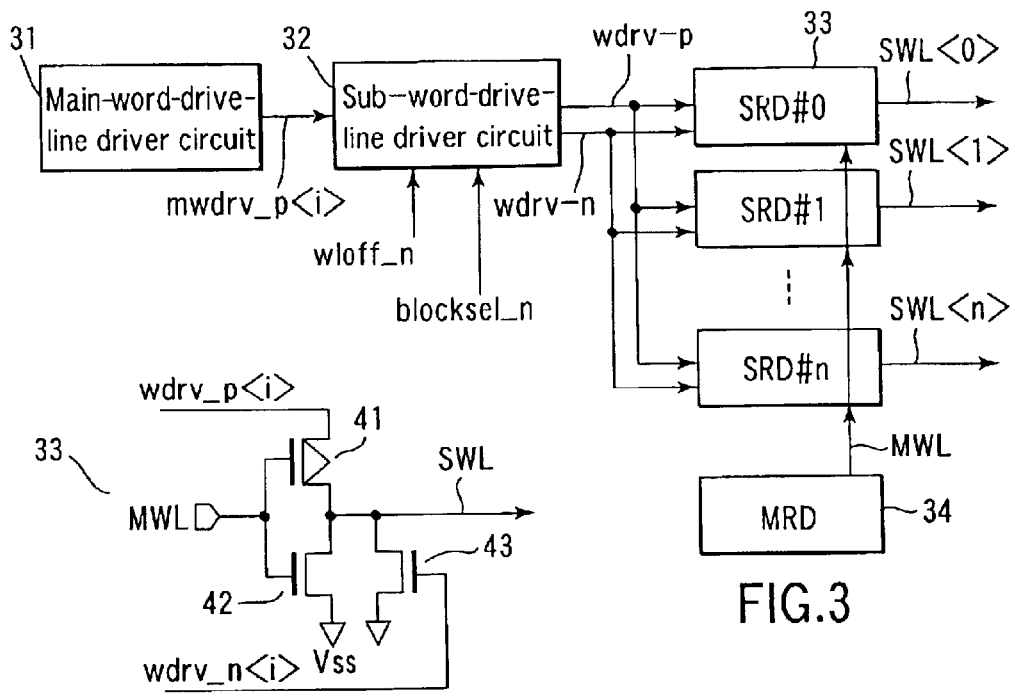
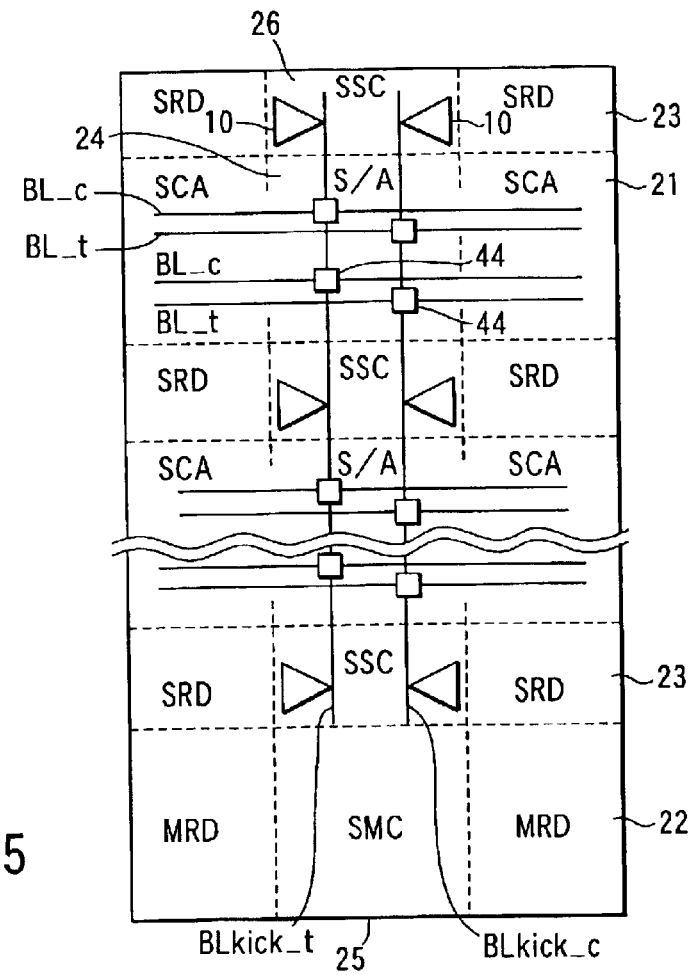
FIG.3
FIG.4
FIG.5

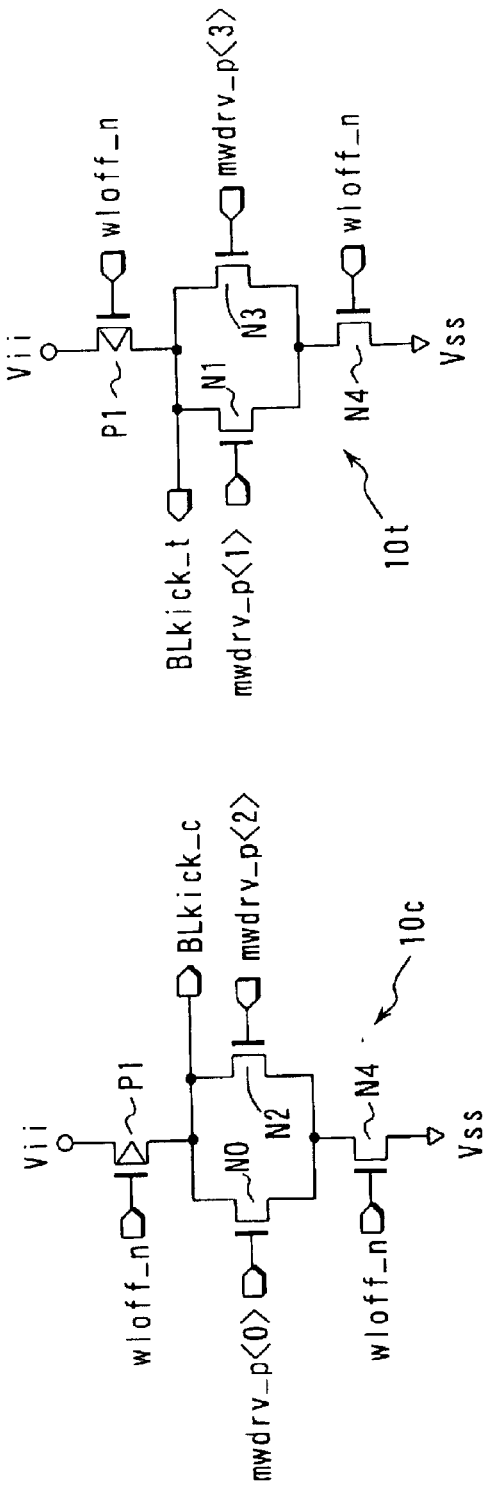
FIG. 9A
FIG. 9B
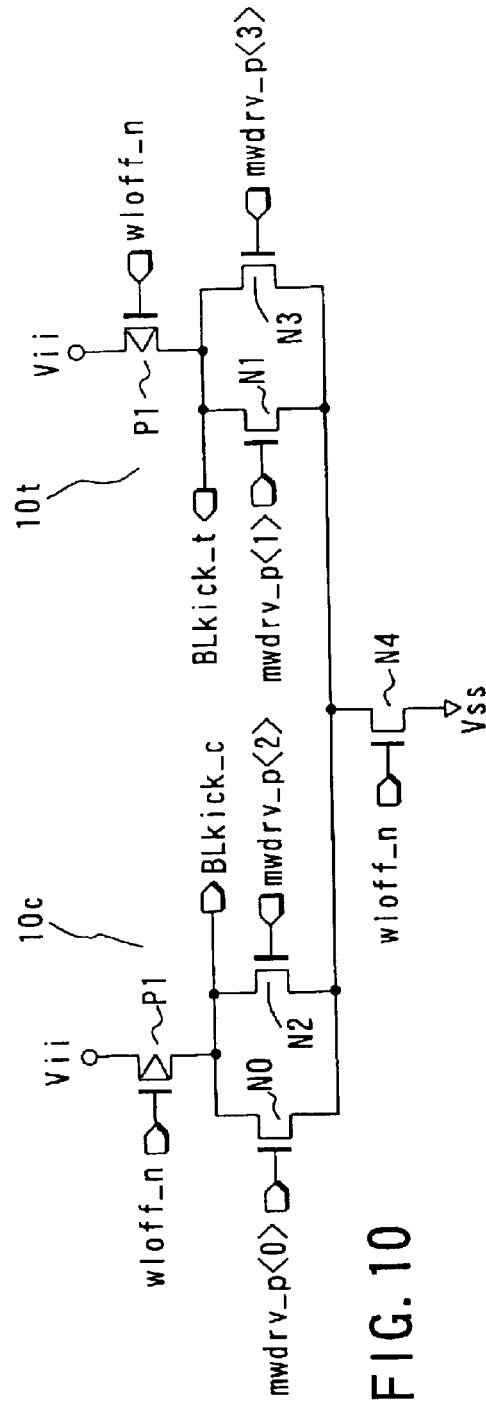
FIG. 10

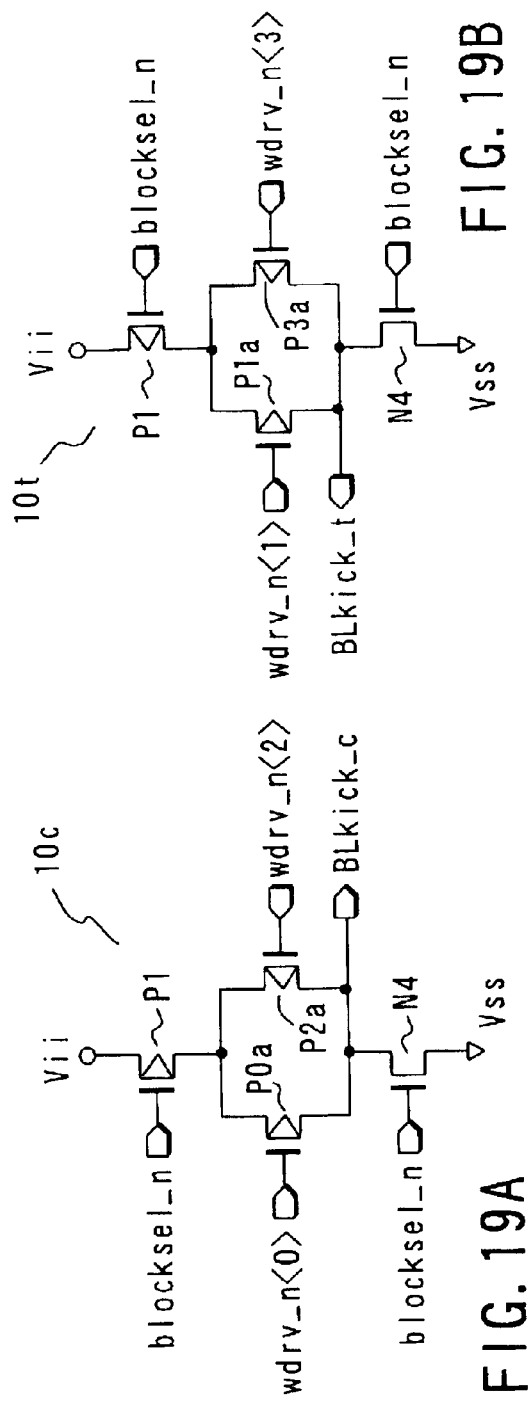
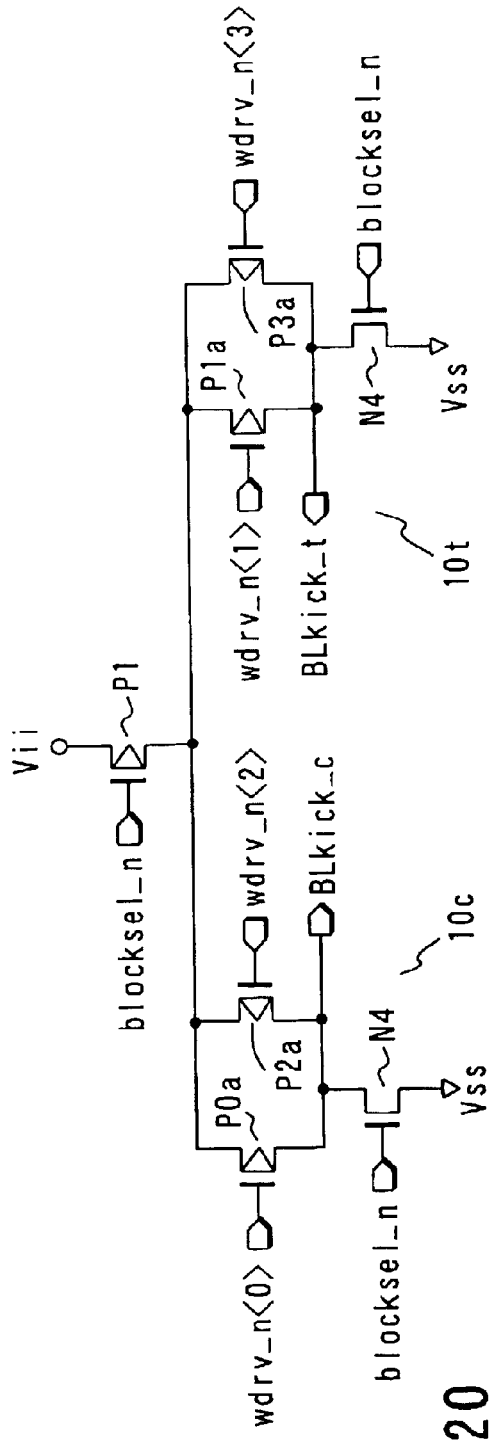
FIG. 19A  FIG. 19B  FIG. 20

SEMICONDUCTOR MEMORY DEVICE HAVING BIT LINE KICKER

CROSS-REFERENCE TO RELATED APPLICATIONS

This application is based upon and claims the benefit of priority from the prior Japanese Patent Application No. 2001-319672, filed on Oct. 17, 2001, the entire contents of which are incorporated herein by reference.

BACKGROUND OF THE INVENTION

1. Field of the Invention

The present invention relates to a semiconductor memory device such as a DRAM. In particular, the present invention relates to a bit line kicker control circuit provided for improving a read margin when reading "H" data from a memory cell.

2. Description of the Related Art

In the DRAM, device micro-fabrication and low power supply voltage have been growing, while it is difficult to secure a capacitance of a memory cell capacitor. The capacitance of the memory cell capacitor requires a margin capacitance in addition to a capacitance equivalent to a lower limit read signal of the sense amplifier sensitivity. In the margin capacitance, the following many factors must be taken into consideration. That is, the factors are non-uniformity of bit line capacitance by the processing non-uniformity of the bit line, various noises of cell array sections, charge leak in PN-junction of cell transistors, data write shortage by threshold dispersion of cell transistors, soft error resistance, etc.

The charge leak in the PN-junction of memory cell results from a recombination current generated in a depletion layer. For this reason, in an "H" data hold time, a leak current from a memory cell is larger than that in an "L" data hold time. In general, since a memory cell transistor of the DRAM is formed of an NMOS transistor, "H" data write shortage by dispersion of the threshold voltage of the memory cell transistor is the problem relevant to "H" data only. Thus, the "H" data has many factors of decreasing a read signal as compared with the "L" data.

For this reason, only when the hold data of the memory cell is an "H" level, a method of increasing the signal read from the memory cell is required. To give an example of the method, until the sense amplifier operation starts after the bit line equalizing operation is released, a potential of only the reference side bit line of the bit line pair is reduced so as to improve a read margin of the "H" data; a so-called bit line kicker technique has been known. According to the above technique, one terminal of a capacitor called a bit line kicker is connected to a bit line; the other terminal thereof is connected to an output node of a driver circuit called a bit line kicker driver. The driver circuit drives the bit line kicker driver so that the bit line potential can be changed.

However, in the conventional case, many control signals must be inputted to the bit line kicker driver; for this reason, it is difficult to dispersedly arrange the bit line kicker driver on a memory core section having no sufficient margin in layout area. As a result, the bit line kicker driver must be arranged on only outer peripheral portions of the core. This problem will be described below in detail.

FIG. 1 shows a circuit configuration of a bit line kicker driver of a conventional DRAM. When a complementary bit line pair is provided as a bit line, a pair of bit line kicker driver lines BLkick t and BLkick c is provided. In FIG. 1, there are shown two pairs of bit line kicker driver lines BLkick t and BLkick c. A pair of bit line kicker drivers 10t and 10c for driving the bit line kicker driver lines BLkick t and BLkick c is arranged for each sense amplifier of a memory cell array.

A decode circuit 11 is provided for each sense amplifier. The decode circuit 11 decodes two kinds of address signals Addr A<0>, Addr A<1>, . . . Addr A<n> and Addr B<0>, Addr B<1>, . . . Addr B<n>, which are positional information of a sense amplifier to be activated. An output of the decode circuit 11 is inputted to the corresponding pair of bit line kicker drivers 10t and 10c in parallel. By doing so, the desired pair of bit line kicker drivers 10t and 10c corresponding to the sense amplifier to be activated is selected.

A set signal Set is used to designate an activation timing of the pair of bit line kicker drivers 10t and 10c. A reset signal Reset is used to designate a non-activation timing of the pair of bit line kicker drivers 10t and 10c. Select signals Sel t and Sel c are used to select which of the pair of bit line kicker drivers 10t and 10c in order to determine whether the bit line kicker driver connected to which of the bit line pair BL t or BL c should be driven.

As described above, in the conventional case, the signals decoding address signals, the set signal Set, the reset signal Reset and the select signals Sel t and Sel c for selecting desired one bit line kicker driver are inputted to the bit line kicker drivers 10t and 10c. For this reason, many control signals must be connected to the bit line kicker drivers 10t and 10c. As a result, it is difficult to dispersedly arrange the bit line kicker driver on a memory core section; therefore, the bit line kicker driver must be arranged on only outer peripheral portions of the core. Consequently, it is difficult to operate the bit line kicker driver line at high speed, and it is desired to solve the above problem.

BRIEF SUMMARY OF THE INVENTION

According to an aspect of the present invention, there is provided a semiconductor memory device comprises: a plurality of cell arrays in which a plurality of memory cells and a plurality of word lines and bit line pairs for selecting the plurality of memory cells are arranged; a plurality of sense amplifiers connected so as to correspond to the plurality of bit line pairs, and configuring a memory core section together with the plurality of cell arrays; a pair of bit line kicker drive lines arranged in the vicinity of the plurality of cell arrays; a pair of bit line kickers connected between the pair of bit line kicker drive lines and each of the plurality of bit line pairs; and a pair of drivers arranged so as to correspond to each cell array in the memory core section, having each output node connected to the pair of bit line kicker drive lines, and driving the pair of bit line kicker drive lines so as to change a potential of one bit line of one of the plurality of bit line pairs via the pair of bit line kickers.

BRIEF DESCRIPTION OF THE SEVERAL VIEWS OF THE DRAWING

FIG. 3 is a block diagram showing a partial circuit configuration of the DRAM shown in FIG. 2;

FIG. 4 is a circuit diagram showing the detailed configuration of a partial circuit of FIG. 3;

FIG. 5 is a pattern diagram showing a part of the chip layout shown in FIG. 2;

FIG. 9A and FIG. 9B are circuit diagrams showing the detailed configuration of the pair of bit line kicker drivers shown in FIGS. 8A and 8B;

FIG. 10 is a circuit diagram showing another detailed configuration of the pair of bit line kicker drivers shown in FIGS. 8A and 8B;

FIG. 19A and FIG. 19B are circuit diagrams showing the detailed configuration of the pair of bit line kicker drivers shown in FIGS. 18A and 18B;

FIG. 20 is a circuit diagram showing another detailed configuration of the pair of bit line kicker drivers shown in FIGS. 18A and 18B;

DETAILED DESCRIPTION OF THE INVENTION

Figure 1:
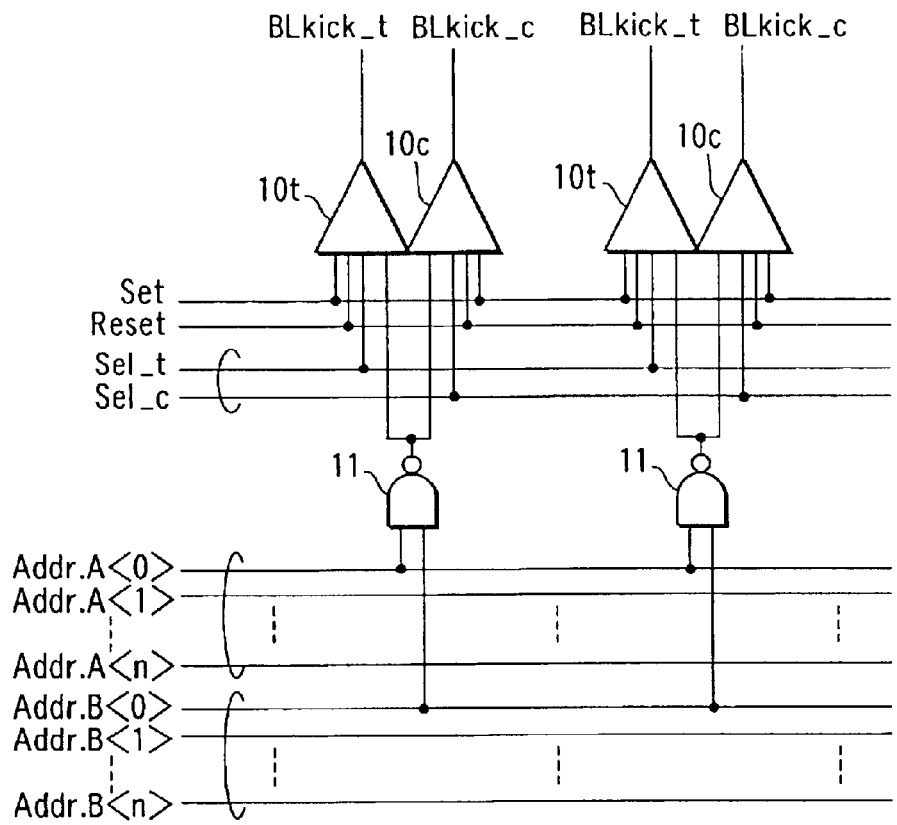
FIG. 1 is a circuit diagram showing the configuration of a bit line kicker driver of a conventional DRAM.

The embodiments of the present invention will be described below in detail with reference to the accompanying drawings. Incidentally, the same reference numerals are given to commonly corresponding portions over all drawings, and the overlapping explanation is omitted.

First Embodiment

Figure 2:
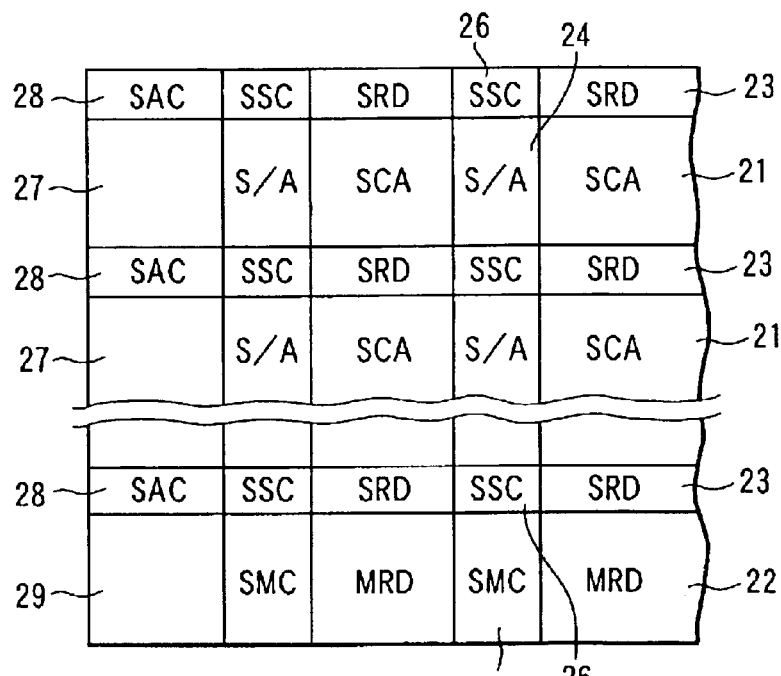
FIG. 2 is a pattern diagram showing a part of a chip layout of a DRAM according to a first embodiment of the present invention.

FIG. 2 shows a memory core section of DRAM chip employing a hierarchical word drive line configuration according to a first embodiment of the present invention. Incidentally, there is shown the case of the hierarchical word drive line configuration, however, the present invention is not limited to the above case.

In FIG. 2, a memory cell array is divided into plural portions arranged like a matrix using a sub-array (SCA) 21 as a unit block. In each sub-array 21, a plurality of word lines and a plurality bit line pairs are arranged in a state of crossing each other, and many memory cells selected by the plurality of word lines and bit line pairs are arranged.

A main row decoder region 22 provided with a main row decoder (MDR) is arranged at one end portion of the word line direction (i.e., column direction) of the same column sub-array. A sub-row decoder region 23 provided with a sub-row decoder (SRD) is arranged so as to be adjacent to each sub-array 21 in the column direction. In other words, the plurality of sub-row decoder regions 23 is arranged between the plurality of sub-arrays 21 arranged in the same column. Moreover, a sense amplifier region 24 is arranged so as to be adjacent to each sub-array 21 in the row direction. The sense amplifier region 24 is provided with a sense amplifier (S/A) connected to the complementary bit line pair. In other words, the plurality of sense amplifier regions 24 is arranged between the plurality of sub-arrays 21 arranged in the same row. Each sense amplifier of the sense amplifier region 24 is commonly used by two adjacent sub-arrays 21 in the column direction of the sub-array placement; a so-called shared method can be employed.

A reference numeral 25 denotes a main cross region (SMC), which is arranged between the main row decoder regions 22. A reference numeral 26 denotes a sub-cross region (SSC), which is arranged at the region where the extensions of the sub-row decoder region 23 and the sense amplifier region 24 intersect each other in their placement direction near each sub-array 21. In other words, the sub-cross region (SSC) 26 is provided so as to correspond to each sub-array 21, and is arranged so that it can be positioned between two adjacent sub-row decoder regions 23 of the plurality of the sub-row decoder regions 23 and two adjacent sense amplifier regions 24 of the plurality of the sense amplifier regions 24.

In the memory core section, the above sub-arrays 21, sub-decoder regions 23, sense amplifier regions 24 and sub-cross regions 26 are two-dimensionally arranged. The memory core outer edge portion positioned on the left side of the memory core is formed with the following various regions, which are one-dimensionally arranged. That is, the regions are regions 27 on the outside of the sense amplifier 24, regions (SAC) 28 on the outside of the sub-cross region 26, and a region 29 adjacent to the above region 28 and the cross region 25. The region 27 is provided with a column select driver and a secondary sense amplifier, for example.

FIG. 3 shows a partial circuit of the memory core section shown in FIG. 2. A main-word-drive-line driver circuit 31 is arranged in the region 28 shown in FIG. 2, and a sub-worddrive-line driver circuit 32 is arranged in the sub-cross region 26 shown in FIG. 2. The main-word-drive-line driver circuit 31 decodes an address signal, and outputs a main word drive signal mwdrv p<i> (i=0, 1, 2, . . . ) to the main-word-drive-line. The main word drive signal mwdrv p<i> (i=0, 1, 2, . . . ) outputted from the same column main-word-drive-line driver circuit 31 is inputted to a plurality of the sub-word-drive-line driver circuits 32 corresponding to the plural sub-arrays 21 arranged in the same column. A sub-array select signal wloff n and a block select signal blocksel n are inputted to the sub-word-drive-line driver circuit 32. The sub-array select signal wloff n is used as a reset signal for setting the sub-word-drive-line driver circuits 32 to a pre-charge state, and the block select signal blocksel n is used for selecting a block including the plurality of sub-arrays. In response to the above input signals, the sub-word-drive-line driver circuit 32 outputs a first word drive signal wdrv p<i> (i=0, 1, 2, . . . ) to a plurality of first word drive lines. Further, the driver circuit 32 outputs a second word drive signal wdrv n<i> (i=0, 1, 2, . . . ) having a level complementary to the first word drive signal to a plurality of second word drive lines. The above first and second word drive signals wdrv p<i> and wdrv n<i> are inputted to a plurality of sub-row decoders 33 (SRD#0, SRD#1, . . . SRD#n) arranged in the sub-row decoder region 23 of the corresponding sub-array 21.

The plurality of sub-row decoders 33 is provided for each sub-array 21 so as to correspond to a plurality of sub-word lines SWL<0>, SWL<1>, . . . SWL<n>. A main word line (MWL) signal is inputted to the plurality of sub-row decoders 33, in addition to the first and second word drive signals wdrv p<i> and wdrv n<i> outputted from the sub-word-drive-line driver circuit 32. In this case, a main row decoder (MRD) 34 provided in the corresponding main row decoder region 22 drives the main word line (MWL). In response to the above input signals, the plurality of sub-row decoders 33 selectively drives the corresponding sub-word lines SWL<0>, SWL<1>, . . . SWL<n>. The sub-word lines SWL<0>, SWL<1>, . . . SWL<n> are connected with a plurality of memory cells.

FIG. 4 shows a circuit configuration of one of the plurality of sub-row decoders 33 shown in FIG. 3. All of the plurality of sub-row decoders 33 have the same circuit configuration, and only the input signal is different.

The sub-row decoder 33 includes a sub-word line drive PMOS transistor 41, a sub-word line potential pull-down NMOS transistor 42 and a noise killer NMOS transistor 43. The sub-word line drive PMOS transistor 41 has a source supplied with the first word drive signal wdrv p<i>, a drain connected to any one of the sub-word lines SWL<0>, SWL<1>, . . . SWL<n>, and a gate connected with the main word line MWL. The sub-word line potential pull-down NMOS transistor 42 has a drain connected to the sub-word line SWL, a source connected to a node of ground potential VSS, and a gate connected with the main word line MWL. The noise killer NMOS transistor 43 is connected in parallel to the NMOS transistor 42, and has a gate supplied with the second word drive signal wdrv n<i>.

FIG. 5 shows a pattern layout in which the bit line kicker driver is dispersedly arranged on the memory core section in the DRAM of FIG. 2.

As shown in FIG. 5, a pair of bit line kicker drivers BLkick c and BLkick t is arranged so as to extend over the plurality of sub-cross regions (SSC) 26 and sense amplifier (S/A) regions 24 of the memory core section. Further, each sub-cross region (SSC) 26 is provided with a pair of bit line kicker drivers 10. In each sense amplifier (S/A) region 24, a pair of bit line kickers 44 including a capacitor element such as a MOS capacitor is connected between the bit line pair BL t and BL c extended into each sense amplifier (S/A) region 24 and the pair of bit line kicker driver lines BLkick c and BLkick t.

Figure 6:
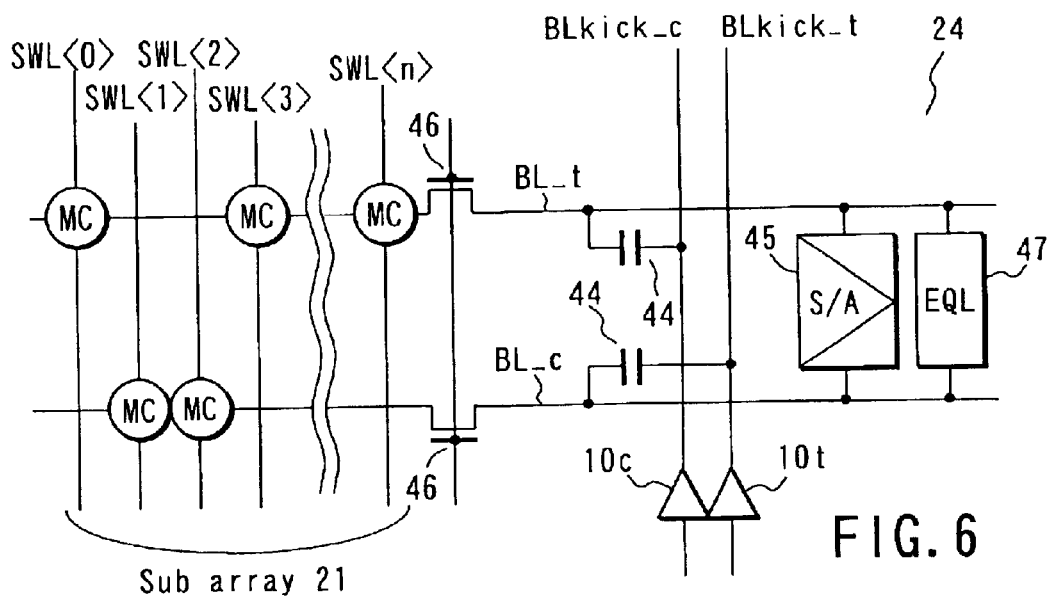
FIG. 6 is a circuit diagram schematically showing one column configuration of a memory core section including a bit line kicker in the DRAM according to the first embodiment.

FIG. 6 schematically shows one column circuit configuration of the memory core section including the bit line kicker 44. In the following, the first embodiment describes the example of reducing only potential of the complementary bit line pair, that is, the reference side bit line, which is not connected with the accessed memory cell.

In the sub-array 21 of the memory core section, the plurality of bit line pairs (typically, only one complementary bit line pair BL t and BL c is shown) and the plurality of sub-word lines SWL<0> to SWL<n> are arranged so as to cross each other. Each crossing portion of the above lines is provided with a memory cell MC.

The bit line pair BL t and BL c is connected with a bit line sense amplifier (S/A) 45 provided in the sense amplifier region 24. The pair of bit line kickers 44 is connected between the bit line kicker drive lines BLkick t and BLkick c and the bit line pair BL t and BL c.

In FIG. 6, similar to the configuration of general DRAM, in the sense amplifier region 24, a pair of bit line transfer gates 46 is inserted on the midway of the bit line pair BL t and BL c. The bit line pair BL t and BL c is connected with a bit line potential equalizer circuit (EQL) 47.

The pair of bit line kicker drive lines BLkick t and BLkick c is connected with each output node of the pair of bit line kicker drivers 10t and 10c. The bit line kicker drivers 10t and 10c drive the bit line kicker drive lines BLkick t and BLkick c, respectively. Further, the pair of bit line kicker drive lines BLkick t and BLkick c has capacitance coupling with not only the above one column bit line pair BL t and BL c but also other column bit line pair. Therefore, the bit line kicker drive lines have a very larger wiring capacitance as compared with other signal lines.

Figure 7:
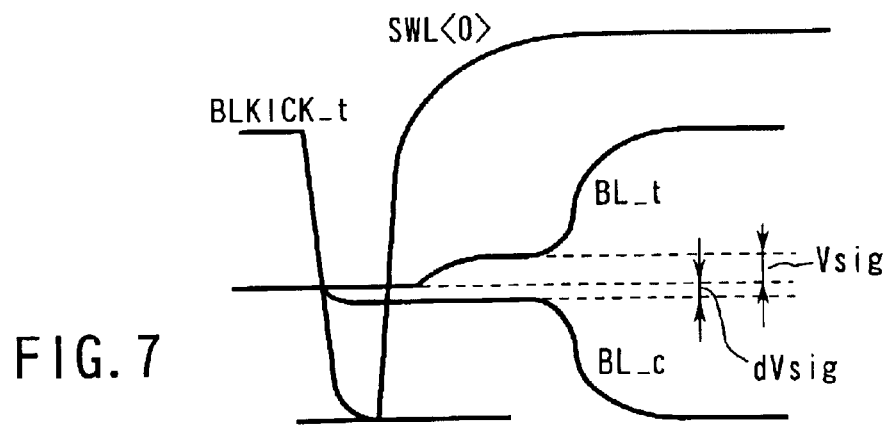
FIG. 7 is a waveform chart showing an operation of the circuit shown in FIG. 6.

FIG. 7 shows a waveform of the operation of the bit line kicker shown in FIG. 6. In FIG. 7, Vsig denotes a read signal from the memory cell MC to the bit line BL t, and dVsig denotes a potential change of the reference side bit line BL c by the operation of the bit line kicker 44.

In this case, the operation of the bit line kicker 44 is carried out in the following manner. First, the bit line potential is pre-charged and equalized to a pre-charge potential, for example, a ½ potential of the power supply potential. After the pre-charge and equalize operation is released, the bit line kicker 44 connected to the bit line pair BL t and BL c, that is, the reference side bit line BL c, which is not connected with the memory cell MC to be selected, is selected. In this case, the bit line kicker drive line BLkick t is activated by the output of the bit line kicker driver 10t, and thereby, the potential of the bit line BL c reduces by dVsig. Thereafter, any of the sub-word lines SWL<0>, SWL<3> to SWL<n> connected to the memory cell MC is selected, and then, information can be read from the memory cell MC to the bit line BL t.

The bit line kicker drive line BLkick t and the bit line BL c have capacitance coupling by the bit line kicker 44. Therefore, in principle, the value of the potential change dVsig of the bit line BL c becomes equal to the product of a capacitance ratio of the bit line BL c to the bit line kicker 44 and the potential amplitude of the bit line kicker drive line BLkick t. As a result, the read signal of the "H" data is Vsig+dVsig, and therefore, increases as compared with the case where no bit line kicker 44 is used.

The pair of bit line kickers 44 connected to the bit line pair BL t and BL c is arranged for each sense amplifier 45, and is driven by the bit line kicker drivers 10t, 10c via the bit line kicker drive line BLkick t or BLkick c. The bit line kicker drive lines BLkick t and BLkick c have a very large capacitance because the bit line kicker 44, that is, a capacitor is connected between the bit lines BL t and BL c.

In order to operate the above bit line kicker drive lines BLkick t and BLkick c by the bit line kicker driver 44 at high speed, it is preferable to dispersedly arrange the bit line kicker drivers 10t and 10c.

In the first embodiment, as illustrated in FIG. 5, the bit line kicker drivers 10t and 10c are dispersedly arranged in each sub-cross region (SSC) 26. Therefore, it is possible to operate the bit line kicker drive lines BLkick t and BLkick c by the pair of bit line kicker drivers 44 at high speed.

Figure 8A:
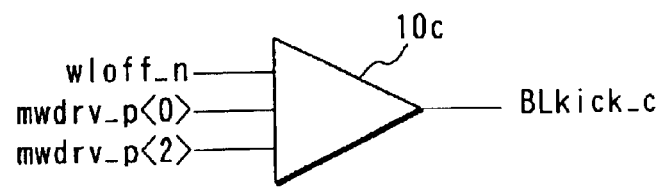
FIG. 8A and FIG. 8B are block diagrams showing a pair of bit line kicker drivers shown in FIG. 6.
Figure 8B:
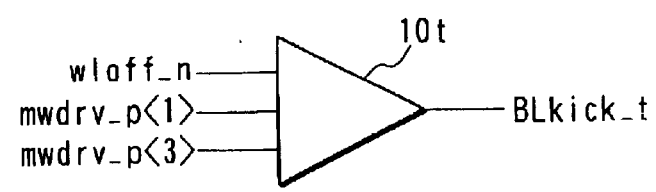

FIG. 8A and FIG. 8B show the above pair of bit line kicker drivers 10t and 10c and control signals inputted to them.

Now, a set of four sub-word lines SWL<0> to SWL<3> selected and controlled by the main word drive signal mwdrv p<i> has attracted special interest. In this case, as shown in FIG. 6, the memory cell MC selected by the first sub-word line SWL<0> is connected to the bit line BL t, and the memory cell MC selected by the second sub-word line SWL<1> is connected to the bit line BL c. Further, the memory cell MC selected by the third sub-word line SWL<2> is connected to the bit line BL c, and the memory cell MC selected by the fourth sub-word line SWL<3> is connected to the bit line BL t.

As seen from FIG. 8A, a sub-array select signal wloff n and main word drive signals mwdrv p<0> and mwdrv p<2> are inputted to one bit line kicker driver 10c. The sub-array select signal wloff n is a signal inputted to the sub-word drive line driver circuit 32 of FIG. 3. The main word drive signals mwdrv p<0> and mwdrv p<2> are signals outputted from the main word drive line driver circuit 31 of FIG. 3.

As seen from FIG. 8B, the sub-array select signal wloff n and main word drive signals mwdrv p<1> and mwdrv p<3> are inputted to the other bit line kicker driver 10t. The sub-array select signal wloff n is a signal inputted to the sub-word drive line driver circuit 32 of FIG. 3. The main word drive signals mwdrv p<1> and mwdrv p<3> are signals outputted from the main word drive line driver circuit 31 of FIG. 3.

The above sub-array select signal wloff n is a signal including positional information of the activated sense amplifier.

As described above, the same control signals as used for controlling the operation of the sub-word drive line driver circuit 32 of FIG. 3 are inputted to the pair of bit line kicker drivers 10t and 10c. In other words, the control input line of the bit line kicker drivers 10t and 10c is used in common to the control input line of other circuits. By doing so, it is possible to reduce the number of the control input line of the bit line kicker drivers 10t and 10c. That is, it is unnecessary to newly provide the control signal lines. Therefore, it is possible to arrange the bit line kicker drivers 10t and 10c in the memory core section without making small the wiring pitch of existing other control signal lines and sacrifing the signal propagation speed of other control signal lines.

The following is a description of various circuit configurations of the pair of bit line kicker drivers 10t and 10c shown in FIG. 8A and FIG. 8B.

FIG. 9A show the circuit configuration of the bit line kicker driver 10c shown in FIG. 8A. In the bit line kicker driver 10c, a PMOS transistor P1, two NMOS transistors N0 and N2 connected in parallel and an NMOS transistor N4 are connected in series between the following nodes Vii and Vss. The node Vii is supplied with an internal power supply potential Vii as a high potential side power supply potential. On the other hand, the node Vss is supplied with a ground potential Vss as a low potential side power supply potential. The drain of the PMOS transistor P1 is connected with one bit line kicker drive line BLkick c.

The sub-array select signal wloff n is inputted to each gate of the PMOS transistor P1 and the NMOS transistor N4.

The main word drive signals mwdrv p<0> and mwdrv p<2> are inputted individually to each gate of the above two NMOS transistors N0 and N2. In this case, the main word drive signal mwdrv p<0> for selecting the first sub-word line SWL<0> is inputted to the gate of the NMOS transistor N0. On the other hand, the main word drive signal mwdrv p<2> for selecting the third sub-word line SWL<2> is inputted to the gate of the NMOS transistor N2.

FIG. 9B show the circuit configuration of the bit line kicker driver 10t shown in FIG. 8B. In the bit line kicker driver 10t, a PMOS transistor P1, two NMOS transistors N1 and N3 connected in parallel and an NMOS transistor N4 are connected in series between the nodes Vii and Vss. The drain of the PMOS transistor P1 is connected with the other bit line kicker drive line BLkick t.

Like the case of FIG. 9A, the sub-array select signal wloff n is inputted to each gate of the PMOS transistor P1 and the NMOS transistor N4.

The main word drive signals mwdrv p<1> and mwdrv p<3> are inputted individually to each gate of the above two NMOS transistors N1 and N3. In this case, the main word drive signal mwdrv p<1> for selecting the second sub-word line SWL<1> is inputted to the gate of the NMOS transistor N1. On the other hand, the main word drive signal mwdrv p<3> for selecting the fourth sub-word line SWL<3> is inputted to the gate of the NMOS transistor N3.

In FIG. 9A and FIG. 9B, the internal power supply potential Vii is a power supply potential stepping down a power supply voltage inputted from the outside in the DRAM chip.

The following is a description of the operation of the driver circuits shown in FIG. 9A and FIG. 9B.

The bit line kicker drive line BLkick c connected to one bit line kicker driver 10c is set and becomes an "L" level when the signal mwdrv p<0>or mwdrv p<2> and the signal wloff n both become an "H" level until the operation of the sense amplifier is started after the bit line equalize operation is released. When the signal wloff n becomes the "L" level, the bit line kicker drive line BLkick c is reset, and becomes the "H" level.

The bit line kicker drive line BLkick t connected to the other bit line kicker driver 10t is set when the signal mwdrv p<1> or mwdrv p<3> and the signal wloff n both become an "H" level, and is reset when the signal wloff n becomes the "L" level.

When one bit line kicker driver 10c is set, that is, when the signal mwdrv p<0> or mwdrv p<2> is an "H" level, the signal mwdrv p<1> or mwdrv p<3> is an "L" level; therefore, the bit line kicker drive line BLkick t connected to the other bit line kicker driver 10t becomes a floating state.

When the other bit line kicker driver 10t is set, that is, when the signal mwdrv p<1> or mwdrv p<3> is an "H" level, the signal mwdrv p<0> or mwdrv p<2> is an "L"

level; therefore, the bit line kicker drive line BLkick c connected to one bit line kicker driver 10c becomes a floating state.

In this case, the set and reset of the bit line kicker drivers 10c and 10t shown in FIG. 9A and FIG. 9B may be activated prior to either of the control signal wloff n and the main word drive signal mwdrv p<i>.

FIG. 10 shows the circuit configuration of the case where the pair of bit line kicker drivers 10c and 10t shown in FIG. 8A and FIG. 8B is integrated.

In either case of the pair of bit line kicker drivers 10c and 10t shown in FIG. 9A and FIG. 9B, the NMOS transistor N4 is provided independently. In the case of FIG. 10, the NMOS transistor N4 is used in common to the pair of bit line kicker drivers 10c and 10t.

In other words, both sources of two NMOS transistors N0 and N2 of the bit line kicker driver 10c and both sources of two NMOS transistors N1 and N3 of the bit line kicker driver 10t are connected in common to the drain of one NMOS transistor N4.

The pair of bit line kicker drivers shown in FIG. 10 is also arranged in each sub-cross region (SSC) 26 of the memory core section. In this case, the NMOS transistor N4 is used in common, and thereby, it is possible to reduce a chip area.

By the way, the pair of bit line kicker drivers shown in FIG. 9A and FIG. 9B uses the control signal wloff n in common. Thus, when one bit line kicker driver is set, the bit line kicker drive line BLkick c or BLkick t connected to the other bit line kicker driver becomes a floating state.

The bit line kicker drive lines BLkick c and BLkick t receive the influence by the potential change of the bit line BL t or BL c because they have capacitance coupling with the bit lines BL t and BL c in all columns. In particular, when the sense amplifier is activated, the potential change of the bit line is large; for this reason, the influence is also great.

For example, when "H" data is read from all memory cells MC connected to the bit line BL c, a noise stepping up the potential is given to the bit line kicker drive line BLkick t by capacitive coupling in all columns. In such a case, the potential of the drain of the PMOS transistor P1 of the bit line kicker driver inputting the control signal wloff n becomes higher than the well potential. As a result, a forward bias is applied to the PN-junction of the PMOS transistor P1.

In order to solve the above problem, a pull-up circuit is connected to the bit line kicker drive lines BLkick c and BLkick t. The following is a description of the example in which the pull-up circuit is connected.

Figure 11:
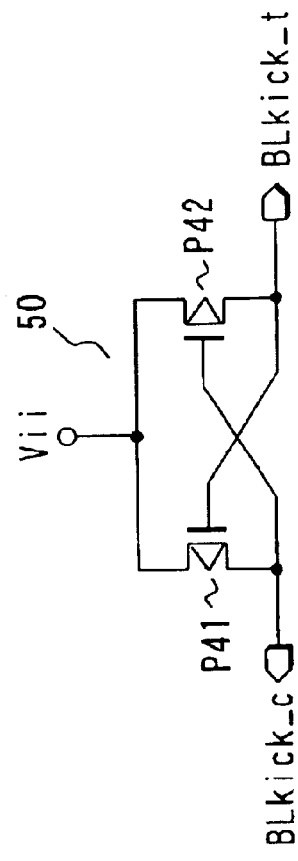
FIG. 11 is a circuit diagram showing the configuration of a pull-up circuit used in a state of being added to the pair of bit line kicker drivers shown in FIGS. 9A, 9B and FIG. 10.

FIG. 11 shows the configuration of a pull-up circuit used together with the pair of bit line kicker drivers shown in FIG. 9A and FIG. 9B.

A pull-up circuit 50 shown in FIG. 11 includes two PMOS transistors P41 and P42. The PMOS transistor P41 has a source/drain connected between the Vii node and the bit line kicker drive line BLkick c, and a gate connected to the bit line kicker drive line BLkick t. The PMOS transistor P42 has a source/drain connected between the Vii node and the bit line kicker drive line BLkick t, and a gate connected to the bit line kicker drive line BLkick c.

The pull-up circuit 50 is arranged in the main cross region (SMC) 25 of the memory core section independently from the pair of bit line kicker drivers arranged in each sub-cross region 26. The pull-up circuit 50 is connected with the pair of bit line kicker drive lines BLkick c and BLkick t in the plurality of sub-arrays 21 arranged in the same column as the main cross region 25 in the sub-array placement.

The following is a description of the operation of the pull-up circuit 50 shown in FIG. 11.

When the pair of bit line kicker drive lines BLkick c and BLkick t is an "H" level, the PMOS transistors P41 and P42 of the pull-up circuit 50 are individually in a non-operating state. When one bit line kicker drive lines BLkick c is set by one bit line kicker driver, and then, becomes an "L" level, the PMOS transistor P42 having the gate connected to the bit line kicker drive lines BLkick c enters an operating state. Thus, the bit line kicker drive lines BLkick t connected to the other bit line kicker driver, which is in a non-operating state, is fixed to the internal power supply potential Vii. By doing so, it is possible to prevent the forward bias from being applied to the PN-junction of the PMOS transistor P1 of the bit line kicker driver connected to the bit line kicker drive lines BLkick t.

Further, the pull-up circuit 50 is arranged in each main cross region (SMC) 25 of the memory core section independently from the pair of bit line kicker drivers. By doing so, it is possible to reduce the number of circuit elements arranged in each sub-cross region (SSC) 26.

As described before, the pair of bit line kicker drive lines BLkick c and BLkick t has capacitance coupling with the bit line in each column; therefore, the capacitance is large. For this reason, when the pull-up circuit 50 shown in FIG. 11 is arranged independently from the pair of bit line kicker drivers, there is the following problem. That is, in the portion far from the above pull-up circuit 50, long time is taken until the pull-up circuit absorbs the noise having capacitance coupling with the bit line kicker drive lines BLkick c and BLkick t.

In order to solve the above problem, the pull-up circuit 50 is arranged in the same sub-cross region (SSC) 26 as the pair of bit line kicker driver; in other words, the pull-up circuit 50 is arranged in the bit line kicker driver. The following is a description of the circuit configuration when the pull-up circuit is arranged in the bit line kicker driver.

Figure 12:
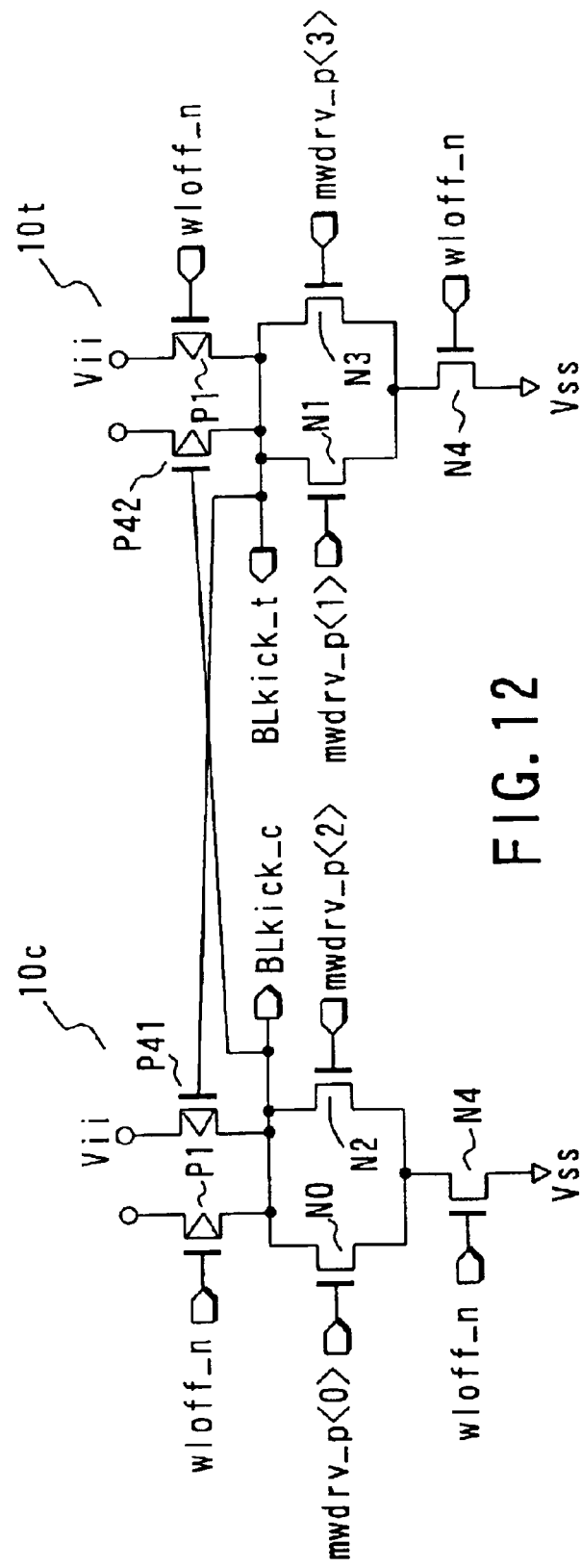
FIG. 12 is a circuit diagram showing still another detailed configuration of the pair of bit line kicker drivers shown in FIGS. 8A and 8B.

FIG. 12 shows the circuit configuration of the case where the pair of bit line kicker drivers 10c and 10t shown in FIG. 8A and FIG. 8B is integrated.

In FIG. 12, the bit line kicker driver circuit section is the same as the pair of bit line kicker drivers described before with reference to FIG. 9A and FIG. 9B. The pull-up circuit section is the same as the pull-up circuit described before with reference to FIG. 11. Thus, the identical reference numerals are given to the same portions as FIG. 9A, FIG. 9B and FIG. 11, and the details are omitted.

In the bit line kicker driver shown in FIG. 12, the pull-up circuit 50 is arranged in each sub-cross region (SSC) 26. By doing so, the pull-up circuit 50 absorbs a noise having capacitive coupling with the bit line kicker drive lines BLkick c and BLkick t for a short time. Therefore, it is possible to securely prevent a forward bias from being applied to the PN-junction of the PMOS transistor P1 of the bit line kicker driver connected to the bit line kicker drive lines BLkick c and BLkick t.

Figure 13:
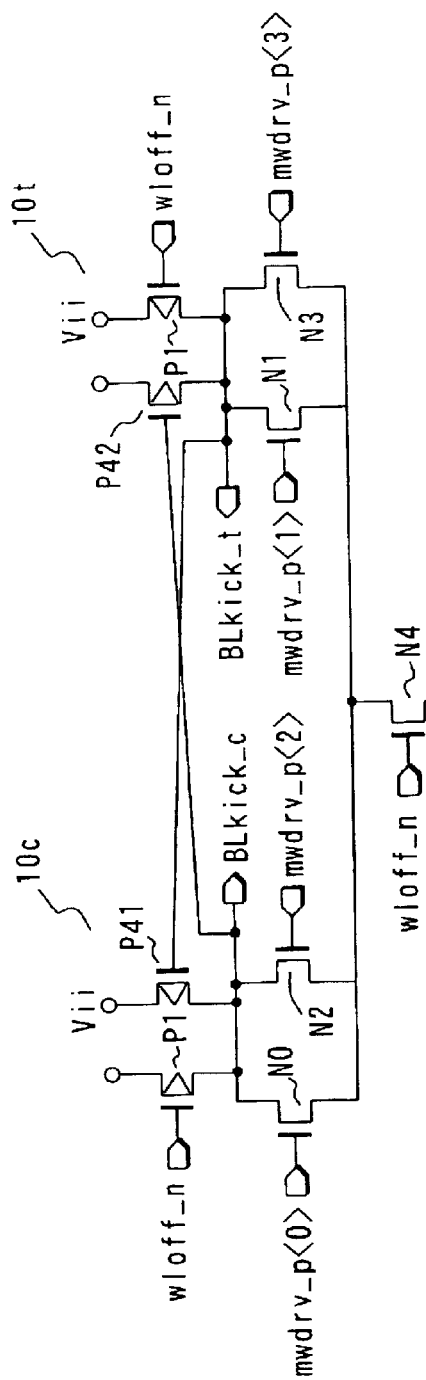
FIG. 13 is a circuit diagram showing still another detailed configuration of the pair of bit line kicker drivers shown in FIGS. 8A and 8B.

FIG. 13 shows another circuit configuration of the case where the pair of bit line kicker drivers 10c and 10t shown in FIG. 8A and FIG. 8B is integrated.

In FIG. 13, the bit line kicker driver section is the same as the pair of bit line kicker driver described before with reference to FIG. 10. The pull-up circuit section is the same as the pull-up circuit described before with reference to FIG. 11. Thus, the identical reference numerals are given to the same portions corresponding to FIG. 11, and the details are omitted. The circuit of FIG. 13 can obtain the same effect by the basically same operation as the circuit of FIG. 12.

Figure 14:
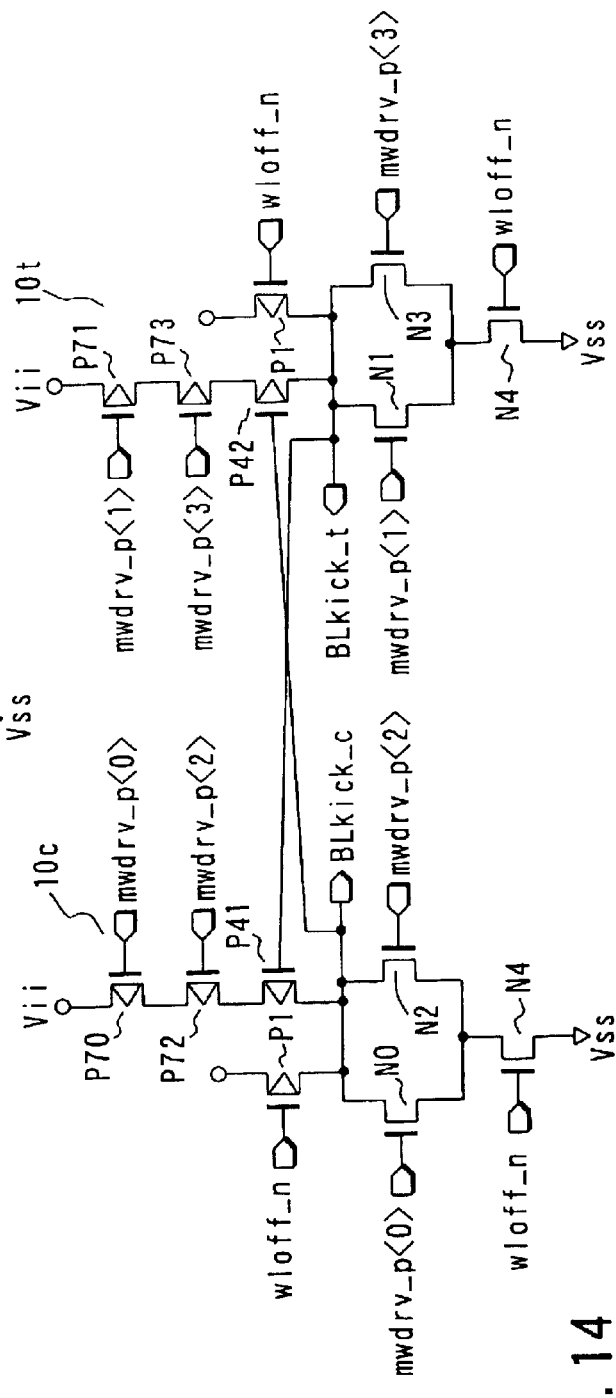
FIG. 14 is a circuit diagram showing still another detailed configuration of the pair of bit line kicker drivers shown in FIGS. 8A and 8B.

FIG. 14 shows another circuit configuration of the case where the pair of bit line kicker drivers 10c and 10t shown in FIG. 8A and FIG. 8B is integrated.

In FIG. 14, the bit line kicker driver section is the same as the pair of bit line kicker driver described before with reference to FIG. 9A and FIG. 9B. Thus, the identical reference numerals are given to the same portions corresponding to FIG. 9A and FIG. 9B, and the details are omitted.

The pull-up circuit section is different from the pull-up circuit described before with reference to FIG. 11 in the following points. That is, another two PMOS transistors P70 and P72 are connected in series between the Vii node and the source of one pull-up PMOS transistor P41, and another two PMOS transistors P71 and P73 are connected in series between the Vii node and the source of the other pull-up PMOS transistor P42.

In this case, the above two PMOS transistors P70 and P72 are inserted into the pull-up circuit section connected to the bit line kicker drive line BLkick c connected with one bit line kicker driver 10c. The control signals mwdrv p<0> and mwdrv p<2> are individually inputted to each gate of the PMOS transistors P70 and P72 in the same manner as each gate of two NMOS transistors N0 and N2 of the bit line kicker driver 10c.

Further, the above two PMOS transistors P71 and P73 are inserted into the pull-up circuit section connected to the bit line kicker drive line BLkick c connected with one bit line kicker driver 10t. The control signals mwdrv p<1> and mwdrv p<3> are individually inputted to each gate of the PMOS transistors P71 and P73 in the same manner as each gate of two NMOS transistors N1 and N3 of the bit line kicker driver 10c.

In the circuit of FIG. 14, the NMOS transistors N0 and N2 of the bit line kicker driver 10c connected commonly to one bit line kicker drive line BLkick c and the PMOS transistors P70 and P72 of the pull-up circuit section are switch-controlled by the same control signals mwdrv p<0> and mwdrv p<2>. Therefore, it is possible to prevent the bit line kicker drive line BLkick c from becoming a floating state.

Likewise, the NMOS transistors N1 and N3 of the bit line kicker driver 10c connected commonly to the other bit line kicker drive line BLkick t and the PMOS transistors P71 and P73 of the pull-up circuit section are switch-controlled by the same control signals mwdrv p<1> and mwdrv p<3>. Therefore, it is possible to prevent the bit line kicker drive line BLkick t from becoming a floating state.

Figure 15:
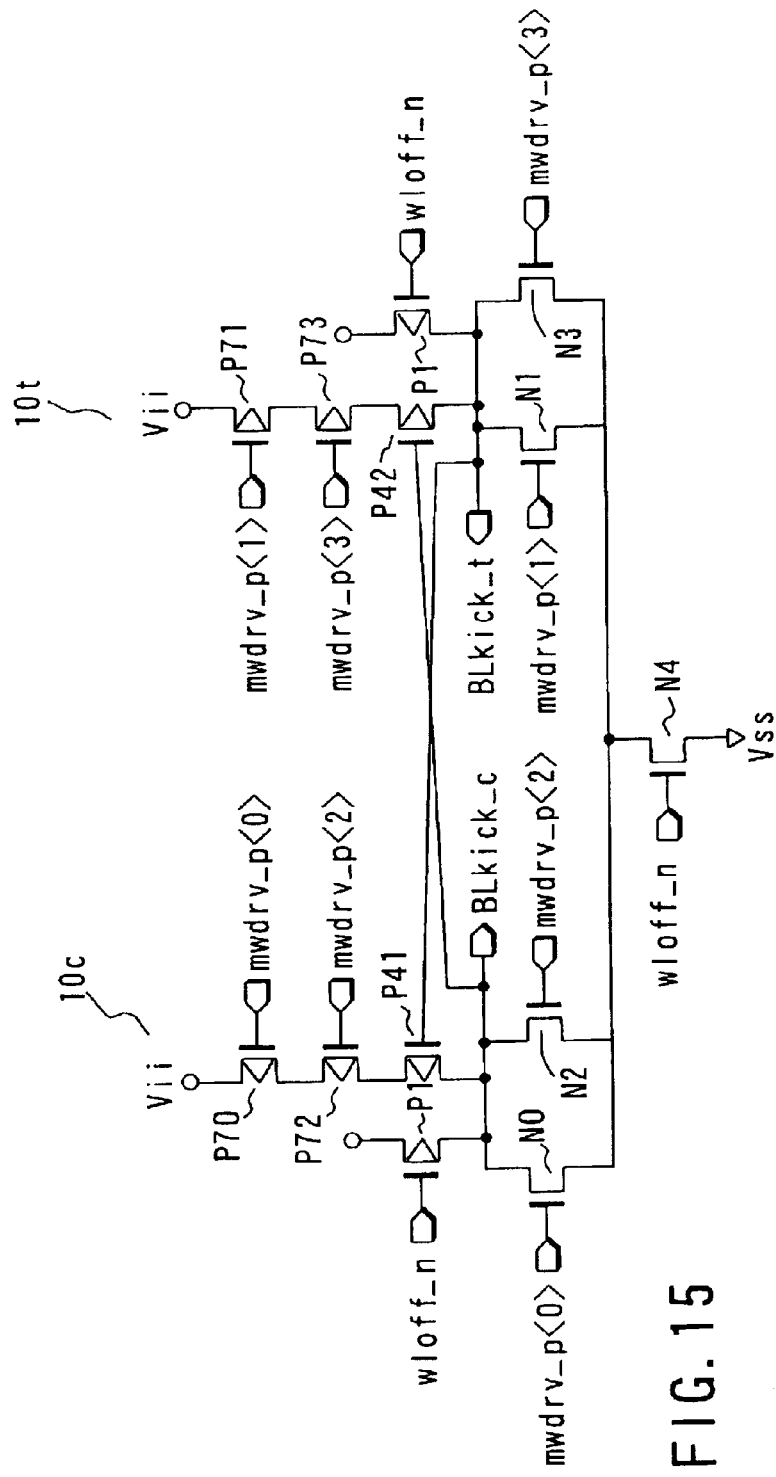
FIG. 15 is a circuit diagram showing still another detailed configuration of the pair of bit line kicker drivers shown in FIGS. 8A and 8B.

FIG. 15 shows still another circuit configuration of the case where the pair of bit line kicker drivers 10c and 10t shown in FIG. 8A and FIG. 8B is integrated.

In FIG. 15, the bit line kicker driver section is the same as the pair of bit line kicker driver described before with reference to FIG. 10. The above pull-up circuit section is the same as the pull-up circuit described before with reference to FIG. 14. Thus, the identical reference numerals are given to the same portions corresponding to FIG. 10 and FIG. 14, and the details are omitted.

The circuit of FIG. 15 can obtain the same effect by the basically same operation as the circuit of FIG. 14.

By the way, in the above first embodiment, capacitor elements such as MOS capacitor have been used as each of the pair of bit line kickers 44 shown in FIG. 5 and FIG. 6. A MOS capacitor formed of NMOS transistor or PMOS transistor may be used as the MOS capacitor. In this case, the gate of the MOS transistor may be connected to the bit line, and the drain diffusion layer and/or source diffusion layer may be connected to the bit line kicker drive line.

In addition, the gate of the MOS transistor may be connected to the bit line kicker drive line, and the drain diffusion layer and/or source diffusion layer thereof the may be connected to the bit line. Or, one of the drain diffusion layer and the source diffusion layer of the MOS transistor may be connected to the bit line, and the other thereof may be made a floating state (non-connected state).

Second Embodiment

The following is a description of the second embodiment of the present invention.

In the DRAM of the above first embodiment, each of the pair of bit line kicker drivers arranged in the sub-cross region (SSC) 26 of FIG. 5 has reduced only potential of the complementary bit line pair, that is, the reference side bit line, which is not connected with the accessed memory cell.

On the contrary, the second embodiment will describe herein the case of stepping up only potential of the bit line on the side, which is connected with the accessed memory cell.

Figure 16:
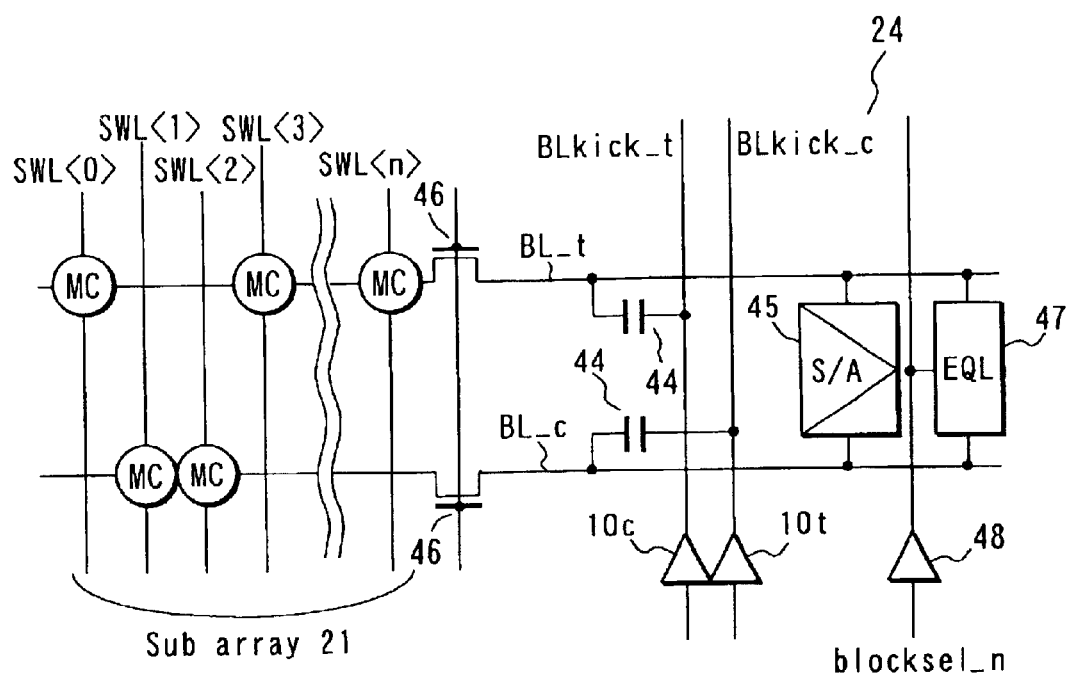
FIG. 16 is a circuit diagram schematically showing one column configuration of a memory core section including a bit line kicker in a DRAM according to a second embodiment of the present invention.

In the second embodiment, the connective relationship between the pair of bit line kicker drive lines BLkick t and BLkick c and the pair of bit line kickers is converse to the configuration described before with reference to FIG. 6 in the first embodiment. More specifically, as shown in FIG. 16, the pair of bit line kicker drive lines BLkick t and BLkick c is arranged so as to pass through a plurality of sense amplifier regions 24 in the same column. Further, each sub-cross region (SSC) 26 of the memory core section is provided with a pair of bit line kicker drivers 10a and 10c corresponding to individual sub-arrays 21. The output nodes of the pair of bit line kicker drivers 10a and 10c are connected individually to the pair of bit line kicker drive lines BLkick t and BLkick c.

A bit line kicker 44 including a MOS capacitor is connected between the pair of bit line pair BL t and BL c connected to each sense amplifier 45 and the pair of bit line kicker drive lines BLkick t and BLkick c. In FIG. 16, the identical reference numerals are given to the same portions as FIG. 6, and the details are omitted.

Figure 17:
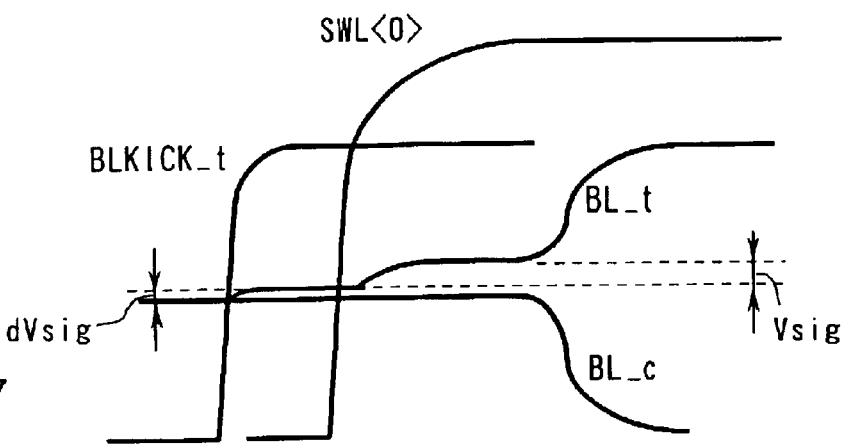
FIG. 17 is a waveform chart showing an operation of the circuit shown in FIG. 16.

FIG. 17 shows a waveform of the operation of the bit line kicker shown in FIG. 16. In FIG. 17, Vsig denotes a read signal from the memory cell MC to the bit line BL t, and dVsig denotes a potential change of the reference side bit line BL c by the operation of the bit line kicker 44.

In this case, the operation of the bit line kicker 44 is carried out in the following manner. First, the bit line potential is pre-charged and equalized to a pre-charge potential, for example, a ½ potential of the power supply potential. After the pre-charge and equalize operation is released, the bit line kicker 44 connected to the bit line pair BL t and BL c, that is, the bit line, which is connected with the memory cell MC to be selected, is selected. In this case, the bit line kicker drive line BLkick t is activated by the output (positive logic in the second embodiment) of the bit line kicker driver 10t, and thereby, the potential of the bit line BL t steps up by dVsig. Thereafter, any of the sub-word lines SWL<0>, SWL<3> to SWL<n> connected to the memory cell MC is selected, and then, information can be read from the memory cell MC to the bit line BL t.

The bit line kicker drive line BLkick t and the bit line BL t have capacitance coupling by the bit line kicker 44. Therefore, in principle, the potential change dVsig of the bit line BL t becomes equal to the product of a capacitance ratio of the bit line BL t to the bit line kicker BLKICKER and the potential amplitude of the bit line kicker drive line BLkick t. As a result, the read signal of the "H" data is Vsig+dVsig, and therefore, increases as compared with the case where no bit line kicker 44 is used.

Figure 18B:
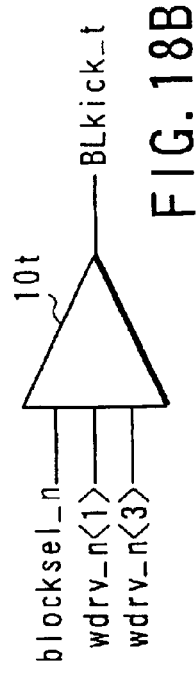
FIG. 18A and FIG. 18B are block diagrams showing a pair of bit line kicker drivers shown in FIG. 16.
Figure 18A:

FIG. 18A and FIG. 18B show the above pair of bit line kicker drivers 10c and 10t and control signals inputted to them.

As also described in the above first embodiment, a set of four sub-word lines SWL<0> to SWL<3> selected and controlled by the main word drive signal mwdrv p<i> has attracted special interest. In this case, as shown in FIG. 16, the memory cell MC selected by the first sub-word line SWL<0> is connected to the bit line BL t, and the memory cell MC selected by the second sub-word line SWL<1> is connected to the bit line BL c. Further, the memory cell MC selected by the third sub-word line SWL<2> is connected to the bit line BL c, and the memory cell MC selected by the fourth sub-word line SWL<3> is connected to the bit line BL t.

As seen from FIG. 18A, a block select signal blocksel n and sub-word drive signals wdrv n<0> and wdrv n<2> are inputted to one bit line kicker driver 10c. The block select signal blocksel n is a signal inputted to the sub-word drive line driver circuit 32 of FIG. 3. The sub-word drive signals wdrv n<0> and wdrv n<2> are signals outputted from the sub-word drive line driver circuit 32 of FIG. 3.

As seen from FIG. 18B, the above block select signal blocksel n and sub-word drive signals wdrv n<1> and wdrv n<3> are inputted to the other bit line kicker driver 10t. The sub-word drive signals wdrv n<1> and wdrv n<3> are signals outputted from the sub-word drive line driver circuit 32 of FIG. 3.

The above block select signal blocksel n is a signal, which includes positional information of the activated sense amplifier, and becomes an "L" level in an active period when the read/write operation is carried out with respect to the memory cell. As shown in FIG. 16, the block select signal blocksel n is inputted to a driver 48 driving a bit line equalizer circuit (EQL) 47 for equalizing the potential of the bit line pair. Further, the block select signal blocksel n is also used as a control signal for controlling a bit line transfer gate (TG) 46 interposed between the bit line pair.

As described above, the same control signals used for controlling the operation of the sub-word drive line driver circuit 32 of FIG. 3 and the output signals of the circuit 32 are inputted to the pair of bit line kicker drivers 10t and 10c. In other words, the control input line of the bit line kicker drivers 10t and 10c is used in common to the control input line of other circuits. By doing so, it is possible to reduce the number of the control input lines of the bit line kicker drivers 10t and 10c. That is, it is unnecessary to newly provide the control signal lines. Therefore, it is possible to arrange the bit line kicker drivers 10t and 10c in the memory core section without making small the wiring pitch of existing other control signal lines and sacrificing the signal propagation speed of other control signal lines.

The following is a description of various circuit configurations of the pair of bit line kicker drivers 10t and 10c shown in FIG. 18A and FIG. 18B.

FIG. 19A shows the circuit—configuration of the bit line kicker driver 10c shown in FIG. 18A. In the bit line kicker driver 10c, a PMOS transistor P1, two PMOS transistors P0a and P2a connected in parallel and an NMOS transistor N4 are connected in series between the following nodes Vii and Vss. The node Vii is supplied with an internal power supply potential Vii as a high potential side power supply potential. On the other hand, the node Vss is supplied with a ground potential Vss as a low potential side power supply potential. The drain of the NMOS transistor N4 is connected with one bit line kicker drive line BLkick c.

The block select signal blocksel n is inputted to each gate of the PMOS transistor P1 and the NMOS transistor N4.

The sub-word drive signals wdrv n<0> and wdrv n<2> are inputted individually to each gate of the above two PMOS transistors P0a and P2a. In this case, the sub-word drive signal wdrv n<0> for selecting the first sub-word line SWL<0> is inputted to the gate of the PMOS transistor P0a. On the other hand, the sub-word drive signal wdrv n<2> for selecting the third sub-word line SWL<2> is inputted to the gate of the PMOS transistor P2a.

FIG. 19B shows the circuit configuration of the bit line kicker driver 10t shown in FIG. 18B. In the bit line kicker driver 10t, a PMOS transistor P1, two PMOS transistors P1a and P3a connected in parallel and an NMOS transistor N4 are connected in series between the nodes Vii and Vss. The drain of the NMOS transistor N4 is connected with the other bit line kicker drive line BLkick t.

Like the case of FIG. 19A, the block select signal blocksel n is inputted to each gate of the PMOS transistor P1 and the NMOS transistor N4.

The sub-word drive signals wdrv n<1> and wdrv n<3> are inputted individually to each gate of the above two PMOS transistors P1a and P3a. In this case, the sub-word drive signal wdrv n<1> for selecting the second sub-word line SWL<1> is inputted to the gate of the PMOS transistor P1a. On the other hand, the sub-word drive signal wdrv n<3> for selecting the fourth sub-word line SWL<3> is inputted to the gate of the PMOS transistor P3a.

The bit line kicker driver shown in FIG. 19A and FIG. 19B differs from the bit line kicker driver described before with reference to FIG. 9A and FIG. 9B in the following points. That is, the PMOS transistors P0a to P3a are used in place of the NMOS transistors N0 to N3, and the signals blocksel n and wdrv n<0> to wdrv n<3> are inputted as the control signal, and further, the signal fetch position of the bit line kicker drive lines BLkick c and BLkick t is different. Others are the same as the bit line kicker driver of FIG. 9A and FIG. 9B. The pair of bit line kicker drivers is arranged in the sub-cross region (SSC) 26 of the memory core section, like the above first embodiment.

In this case, the positional information of the activated sense amplifier is used as the control signal, and the block select signal blocksel n is used in place of the sub-array select signal wloff n. The block select signal blocksel n becomes an "L" level in an active period when the read/write operation is carried out with respect to the memory cell.

The following is a description of the operation of the driver circuits shown in FIG. 19A and FIG. 19B.

The first bit line kicker drive line BLkick c connected to one bit line kicker driver 10c is set and becomes an "H" level when the control signal wdrv n<0> or wdrv n<2> and the signal blocksel n both become an "L" level. When the signal blocksel n becomes the "H" level, the first bit line kicker drive line BLkick c is reset, and then, becomes the "L" level.

The second bit line kicker drive line BLkick t connected to the other bit line kicker driver 10t is set and becomes an "H" level when the control signal wdrv n<1> or wdrv n<3> and the signal blocksel n both become an "L" level. When the signal blocksel n becomes the "H" level, the second bit line kicker drive line BLkick t is reset, and then, becomes the "L" level When one bit line kicker driver 10c is set, that is, when the control signal wdrv n<0> or wdrv n<2> is an "L" level, the control signal wdrv n<1> or wdrv n<3> is an "H" level; therefore, the second bit line kicker drive line BLkick t connected to the other bit line kicker driver 10t becomes a floating state.

When the other bit line kicker driver 10t is set, that is, when the control signal wdrv n<1> or wdrv n<3> is an "L" level, the signal wdrv n<0> or wdrv n<2> is an "H" level; therefore, the first bit line kicker drive line BLkick c connected to one bit line kicker driver 10c becomes a floating state.

In the above bit line kicker driver shown in FIG. 19A and FIG. 19B, the control signals blocksel n and wdrv n<0> to wdrv n<3> are used. Therefore, the control input line is used in common to the control input line of other circuits, and the bit line kicker driver is dispersedly arranged in each sub-cross region 26. As a result, it is possible to reduce the chip area based on the same reason as the first embodiment.

FIG. 20 shows the circuit configuration of the case where the pair of bit line kicker drivers 10c and 10t shown in FIG. 18A and FIG. 18B is integrated.

In either case of the pair of bit line kicker drivers 10c and 10t shown in FIG. 19A and FIG. 19B, the PMOS transistor P1 is provided independently. In the case of FIG. 20, the PMOS transistor P1 is used in common to the pair of bit line kicker drivers 10c and 10t.

In other words, both sources of two PMOS transistors P0a and P2a of the bit line kicker driver 10c and both sources of two PMOS transistors P1a and P3a of the bit line kicker driver 10t are connected in common to the drain of one PMOS transistor P1.

The pair of bit line kicker drivers shown in FIG. 20 is also arranged in each sub-cross region (SSC) 26 of the memory core section. In this case, the PMOS transistor P1 is used in common to the pair of bit line kicker drivers, and thereby, it is possible to reduce a chip area.

The pair of bit line kicker drivers shown in FIG. 19A and FIG. 19B uses the control signal blocksel n in common. Thus, when one bit line kicker driver is set, the bit line kicker drive line BLkick c or BLkick t connected to the other bit line kicker driver becomes a floating state.

The bit line kicker drive lines BLkick c and BLkick t receive the influence by the potential change of the bit line BL t or BL c because they have capacitance coupling with the bit lines BL t and BL c in all columns. In particular, when the sense amplifier is activated, the potential change of the bit line is large; for this reason, the influence is also great.

For example, when "L" data is read from all memory cells MC connected to the bit line BL t, a noise stepping down the potential is given to the bit line kicker drive line BLkick t by capacitive coupling in all columns. In such a case, the potential of the drain of the NMOS transistor N4 inputting the control signal blocksel n becomes lower than the well potential. As a result, a forward direction bias is applied to the PN-junction of the NMOS transistor N4.

In order to solve the above problem, a pull-down circuit is connected to the bit line kicker drive lines BLkick c and BLkick t. The following is a description of the example in which the pull-down circuit is connected.

Figure 21:
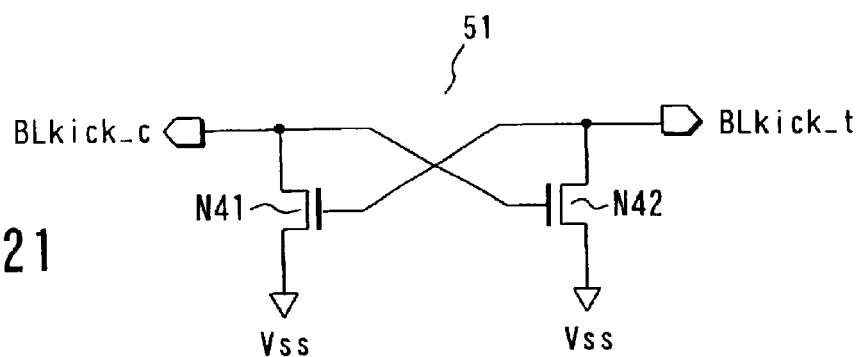
FIG. 21 is a circuit diagram showing the configuration of a pull-up circuit used in a state of being added to the pair of bit line kicker drivers shown in FIGS. 19A, 19B and FIG. 20.

FIG. 21 shows the configuration of a pull-down circuit 51 used together with the pair of bit line kicker drivers shown in FIG. 19A and FIG. 19B.

A pull-down circuit 51 shown in FIG. 21 includes two NMOS transistors N41 and N42. The NMOS transistor N41 has a source/drain connected between the bit line kicker drive line BLkick c and the Vss node, and a gate connected to the bit line kicker drive line BLkick t. The NMOS transistor N42 has a source/drain connected between the bit line kicker drive line BLkick t and the Vss node, and a gate connected to the bit line kicker drive line BLkick c.

The pull-down circuit 51 is arranged in the main cross region (SMC) 25 of the memory core section independently from the pair of bit line kicker drivers arranged in each sub-cross region 26. The pull-down circuit 51 is connected with the pair of bit line kicker drive lines BLkick c and BLkick t in the plurality of the sub-arrays 21 arranged in the same column as the main cross region 25 in the sub-array placement.

The following is a description of the operation of the pull-down circuit 51 shown in FIG. 21.

When the pair of bit line kicker drive lines BLkick c and BLkick t is an "L" level, the NMOS transistors N41 and N42 of the pull-down circuit 51 are individually in a non-operating state. When one bit line kicker drive lines BLkick c is set by one bit line kicker driver, and then, becomes an "H" level, the NMOS transistor N42 having the gate connected to the bit line kicker drive lines BLkick c enters an operating state. Thus, the bit line kicker drive lines BLkick t connected to the other bit line kicker driver, which is in a non-operating state, is fixed to the ground potential Vss. By doing so, it is possible to prevent the forward bias from being applied to the PN-junction of the NMOS transistor N4 of the bit line kicker driver 10t connected to the bit line kicker drive lines BLkick t.

Further, the pull-down circuit 51 is arranged in each main cross region (SMC) 25 of the memory core section independently from the pair of bit line kicker drivers. By doing so, it is possible to reduce the number of circuit elements arranged in each sub-cross region (SSC) 26.

As described before, the pair of bit line kicker drive lines BLkick c and BLkick t has capacitance coupling with the bit line in each column; therefore, the capacitance is large. For this reason, when the pull-down circuit 51 shown in FIG. 21 is arranged independently from the pair of bit line kicker drivers, there is the following problem. That is, in the portion far from the above pull-down circuit 51, long time is taken until the pull-down circuit absorbs the noise having capacitance coupling with the bit line kicker drive lines BLkick c and BLkick t.

In order to solve the above problem, the pull-down circuit 51 is arranged in the same sub-cross region (SSC) 26 as the pair of bit line kicker driver; in other words, the pull-down circuit is arranged in the bit line kicker driver. The following is a description of the circuit configuration when the pull-down circuit is arranged in the bit line kicker driver.

Figure 22:
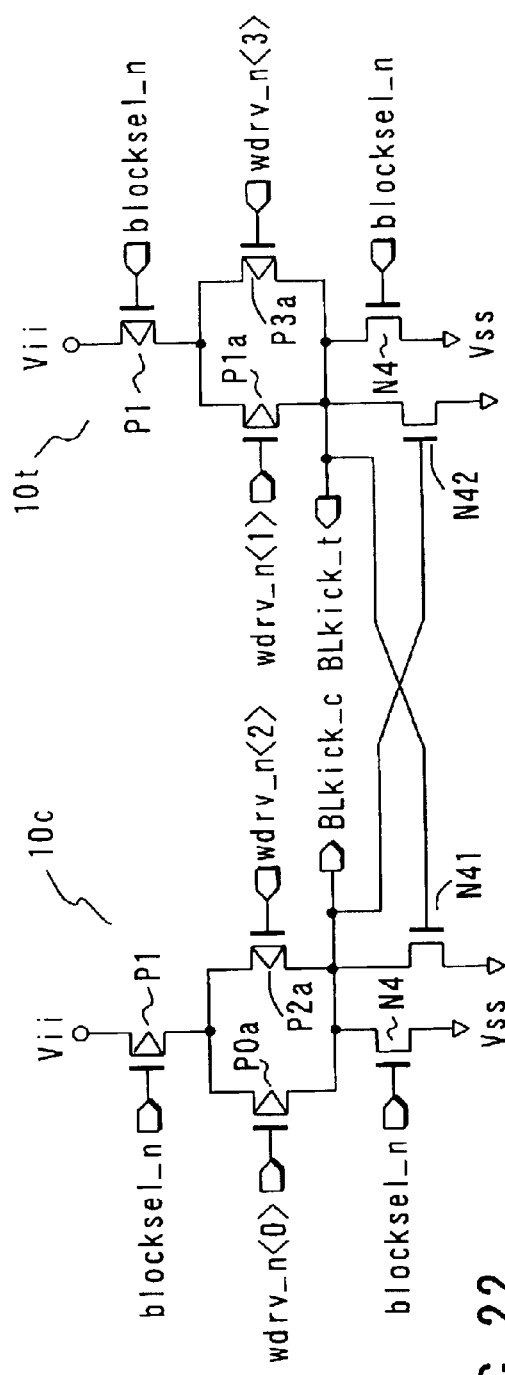
FIG. 22 is a circuit diagram showing still another detailed configuration of the pair of bit line kicker drivers shown in FIGS. 18A and 18B.

FIG. 22 shows the circuit configuration of the case where the pair of bit line kicker drivers 10c and 10t shown in FIG. 18A and FIG. 18B is integrated.

In FIG. 22, the bit line kicker driver circuit section is the same as the pair of bit line kicker drivers described before with reference to FIG. 19A and FIG. 19B. The pull-down circuit section is the same as the pull-up circuit described before with reference to FIG. 21. Thus, the identical reference numerals are given to the same portions as FIG. 19A, FIG. 19B and FIG. 21, and the details are omitted.

In the circuit shown in FIG. 22, the pull-down circuit is arranged in each sub-cross region (SSC) 26. By doing so, the pull-down circuit can absorb a noise having capacitive coupling with the bit line kicker drive lines BLkick c and BLkick t for a short time. Therefore, it is possible to securely prevent the forward bias from being applied to the PN-junction of the NMOS transistors of the bit line kicker driver.

Figure 23:
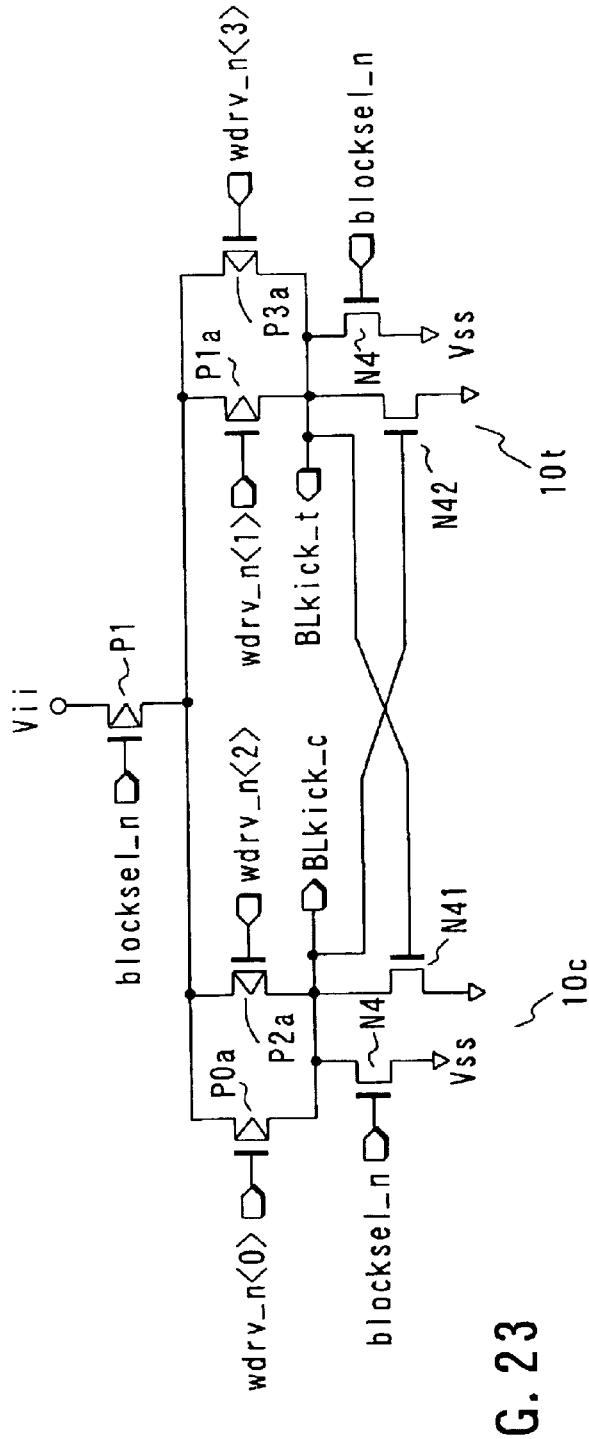
FIG. 23 is a circuit diagram showing still another detailed configuration of the pair of bit line kicker drivers shown in FIGS. 18A and 18B.

FIG. 23 shows another circuit configuration of the case where the pair of bit line kicker drivers 10c and 10t shown in FIG. 18A and FIG. 18B is integrated.

In FIG. 23, the bit line kicker driver section is the same as the pair of bit line kicker drivers described before with reference to FIG. 20. The above pull-down circuit section is the same as the pull-down circuit described before with reference to FIG. 21. Thus, the identical reference numerals are given to the same portions corresponding to FIG. 21, and the details are omitted. The circuit of FIG. 23 can obtain the same effect by the basically same operation as the circuit of FIG. 22.

Figures 24, 25:
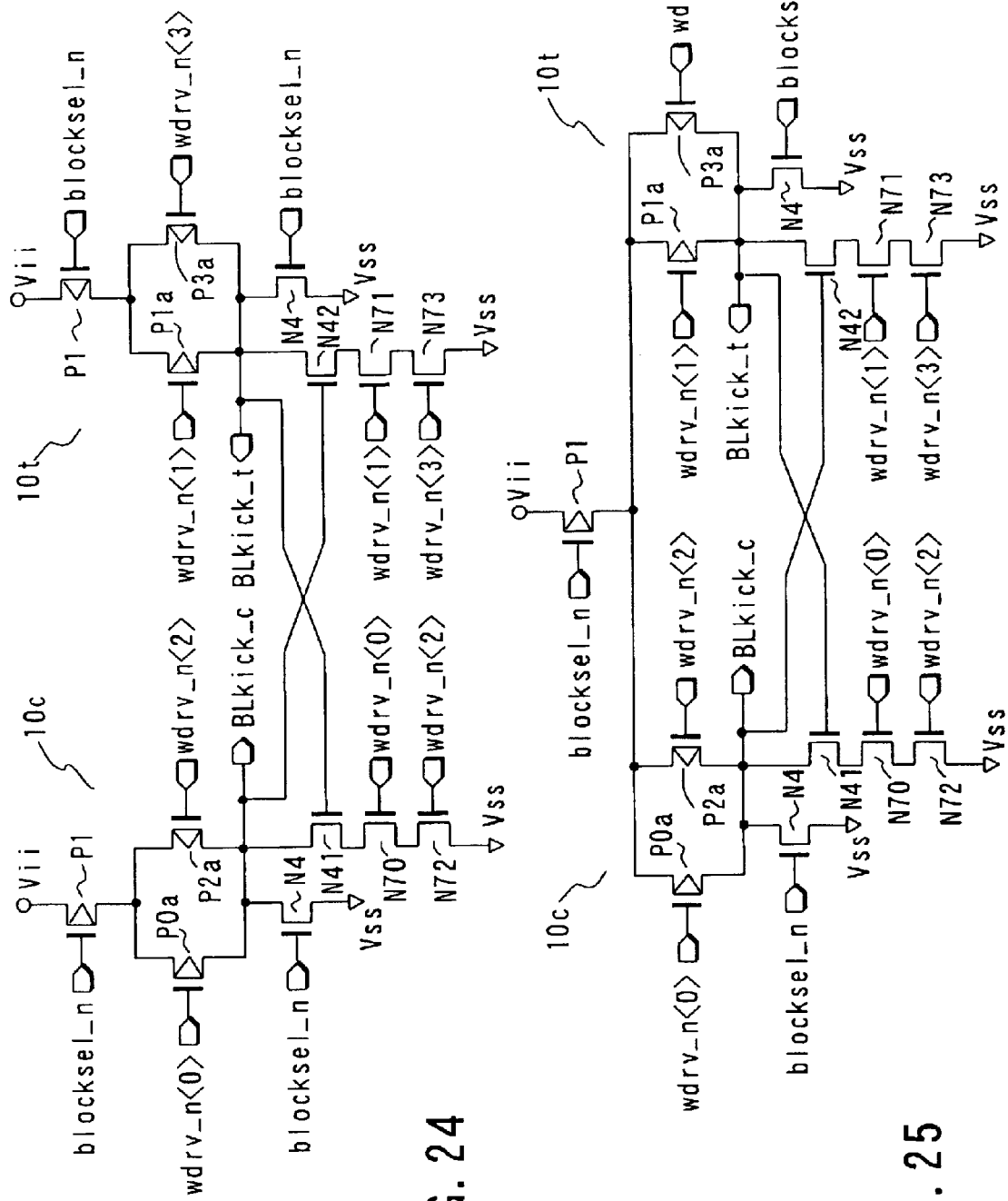
FIG. 24 is a circuit diagram showing still another detailed configuration of the pair of bit line kicker drivers shown in FIGS. 18A and 18B.
FIG. 25 is a circuit diagram showing still another detailed configuration of the pair of bit line kicker drivers shown in FIGS. 18A and 18B.

FIG. 24 shows another circuit configuration of the case where the pair of bit line kicker drivers 10c and 10t shown in FIG. 18A and FIG. 18B is integrated.

In FIG. 24, the bit line kicker driver section is the same as the pair of bit line kicker drivers described before with reference to FIG. 19A and FIG. 19B. Thus, the identical reference numerals are given to the same portions corresponding to FIG. 19A and FIG. 19B, and the details are omitted.

The pull-down circuit section is different from the pull-down circuit described before with reference to FIG. 21 in the following points. That is, another two NMOS transistors N70 and N72 are connected in series between the source of one pull-down NMOS transistor N41 and the Vss node, and another two NMOS transistors N71 and N73 are connected in series between the source of the other pull-down NMOS transistor N42 and the Vss node.

In this case, the above two NMOS transistors N70 and N72 are inserted into the pull-down circuit section connected to the bit line kicker drive line BLkick c connected with one bit line kicker driver 10c. The control signals wdrv n<0> and wdrv n<2> are individually inputted to each gate of the NMOS transistors N70 and N72 in the same manner as each gate of two PMOS transistors P0a and P2a of the bit line kicker driver 10c.

Further, the above two NMOS transistors N71 and N73 are inserted into the pull-down circuit section connected to the bit line kicker drive line BLkick c connected with one bit line kicker driver 10t. The control signals wdrv n<1> and wdrv n<3> are individually inputted to each gate of the NMOS transistors N71 and N73 in the same manner as each gate of two PMOS transistors P1a and P3a of the bit line kicker driver 10t.

In the circuit of FIG. 24, the PMOS transistors P0a and P2a of the bit line kicker driver 10c connected commonly to one bit line kicker drive line BLkick c and the NMOS transistors N70 and N72 of the pull-down circuit section are switch-controlled by the same control signals wdrv n<0> and wdrv n<2>. Therefore, it is possible to prevent the bit line kicker drive line BLkick c from becoming a floating state.

Likewise, the PMOS transistors P1a and P3a of the bit line kicker driver 10c connected commonly to the other bit line kicker drive line BLkick t and the NMOS transistors N71 and N73 of the pull-down circuit section are switch-controlled by the same control signals wdrv n<1> and wdrv n<3>. Therefore, it is possible to prevent the bit line kicker drive line BLkick t from becoming a floating state.

FIG. 25 shows still another circuit configuration of the case where the pair of bit line kicker drivers 10c and 10t shown in FIG. 18A and FIG. 18B is integrated.

In FIG. 25, the bit line kicker driver section is the same as the pair of bit line kicker drivers described before with reference to FIG. 20. The above pull-down circuit section is the same as the pull-down circuit described before with reference to FIG. 24. Thus, the identical reference numerals are given to the same portions corresponding to FIG. 20 and FIG. 24, and the details are omitted.

The circuit of FIG. 25 can obtain the same effect by the basically same operation as the circuit of FIG. 24.

Third Embodiment

The following is a description of the third embodiment of the present invention.

The above first and second embodiments have described the hierarchical word drive line configuration in the DRAM described before with reference to FIG. 5. That is, in the DRAM, the pair of bit line kicker drivers (first and second bit line kicker drivers) is arranged in each sub-cross region (SSC) 26 of the memory core section. According to the third embodiment, only one of the pair of bit line kicker drivers is dispersedly arranged in each sub-cross region (SSC) 26. In the following, the detailed description will be given.

Figure 26:
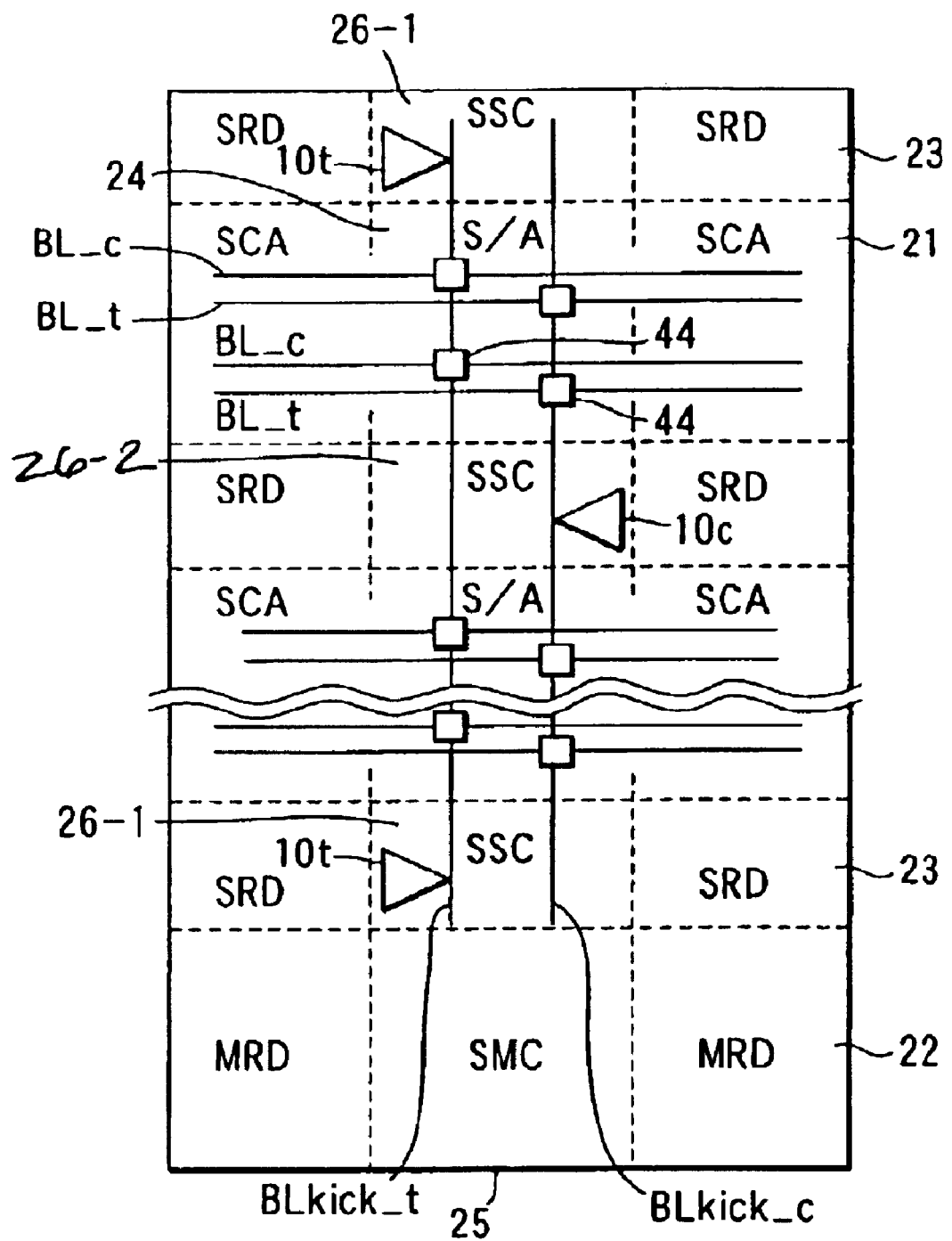
FIG. 26 is a pattern diagram showing a part of the chip layout of a DRAM according to a third embodiment of the present invention.

FIG. 26 shows a pattern layout in which the bit line kicker driver is dispersedly arranged in the memory core section in the DRAM of the third embodiment.

The pattern layout shown in FIG. 26 differs from that shown in FIG. 5 in the following points. Since others are the same as FIG. 5, the reference numerals identical to FIG. 5 are used. More specifically, the plurality of sub-cross regions (SSC) 26 arranged in the same column is divided into a first sub-cross region (SSC) 26-1 and a second sub-cross region (SSC) 26-2, which are arranged alternately along the column direction. Taking the pair of bit line kicker drivers 10c and 10t, for example, one bit line kicker driver 10c is arranged in the first sub-cross region (SSC) 26-1, and the other bit line kicker driver 10t is arranged in the second sub-cross region (SSC) 26-2. Only one bit line kicker drivers 10c or the other bit line kicker drivers 10t is selected with respect to one-time activation of the control signal wloff n.

Even if the above modification is made, the same effect as the first embodiment can be substantially obtained. Besides, the number of the bit line kicker drivers provided in the first and second sub-cross regions 26-1 and 26-2 is reduced to one; therefore, it is possible to readily design the pattern layout in the first and second sub-cross regions 26-1 and 26-2.

In the above embodiments, when describing each bit line kicker driver circuit in detail, the high potential side power supply potential is the internal power supply potential Vii. The larger the potential amplitude of the bit line kicker drive line is, the greater the bit line kicker effect becomes. Thus, the high potential side power supply potential/low potential side power supply potential of the bit line kicker driver is not limited to the above internal power supply potential Vii/ ground potential Vss. In this case, the following potentials may be employed as the potential. That is, the potentials are step-up potential Vpp/negative potential Vnn or step-up potential Vpp/ground potential Vss or internal power supply potential Vii/negative potential Vnn.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device having a bit line kicker, comprising:
   a plurality of sub-arrays provided with a plurality of word lines and a plurality of bit line pairs and a plurality of memory cells selected by the plurality of word lines and bit line pairs, and arranged in a matrix fashion;
   a main word drive line driver circuit arranged in common to the plurality of sub-arrays, that is, a plurality of sub-arrays arranged in the same column;
   sub-word drive line driver circuit provided so as to correspond to each of the plurality of sub-arrays, and receiving an output from the main word drive line driver circuit;
   a plurality of row decoder regions arranged between the plurality of sub-arrays arranged in the same column, and provided with a plurality of row decoders for driving the plurality or word lines of the plurality of sub-arrays, that is, the corresponding sub-array;
   a plurality of sense amplifier regions arranged between the plurality of sub-arrays arranged in the same row, and provided with a plurality of sense amplifiers connected to the plurality of bit lines pairs of the plurality of sub-arrays, that is, the corresponding sub-array;
   a pair of bit line kicker drive lines arranged so as to pass through the plurality of sense amplifiers regions, and provided so as to correspond to the plurality of sub-arrays arranged in same column;
   a pair of bit line kickers provided for each of the plurality of sub-arrays, and connected between the pair of bit line kicker drive lines and each of the plurality of bit lines pairs; and
   at least one driver provided so as to correspond to each of the plurality of sub-arrays, arranged in each sub-cross region positioned between two adjacent row decoder regions of the plurality of row decoder regions and between two adjacent sense amplifier regions of the plurality of sense amplifier regions, the at least one driver receiving at least a control signal used for selecting a sub-array including an accessed memory cell of the plurality of sub-arrays, the at least one driver having each output node connected to the pair of bit line kicker drive lines, and the at least one driver changing a potential of one bit line so as to increase either of "H" data read signal of "L" data read signal read from one bit line.
   wherein the control signal includes a first control signal including positional information of the plurality of sense amplifiers, that is, an activated sense amplifier, and a second control signal including information representing to which bit line of the bit line pairs that the accessed memory cell is connected.

2. The semiconductor memory device according to claim 1, wherein at least one driver includes a pair of drivers.

3. The semiconductor memory device according to claim 1, wherein at least one driver steps up a potential of one of the bit line pairs, that is, the bit line on the side, which is connected with the accessed memory cell.

4. The semiconductor memory device according to claim 1, wherein at least one driver steps down a potential of one of the bit line pairs, that is, the bit line on the side, which is connected with the accessed memory cell.

5. The semiconductor memory device according to claim 1, wherein the first control signal is a block select signal for selecting and designating the plurality of sub-arrays arranged in the same column.

6. The semiconductor memory device according to claim 1, wherein the second control signal is a word line select signal for selecting and controlling the word line of the sub-array.

7. The semiconductor memory device according to claim 1, wherein the first control signal is a reset signal for setting the sub-word drive line driver circuit to a pre-charge state.

8. The semiconductor memory device according to claim 1, wherein the first control signal is a signal used for controlling a bit line equalizer circuit for equalizing a potential of the bit line pairs and/or a bit line transfer gate interposed between the bit line pairs.

9. The semiconductor memory device according to claim 1, wherein the second control signal is a signal outputted from the main word drive line driver circuit.

10. The semiconductor memory device according to claim 1, wherein the second control signal is a signal of a sub-word drive line driven by the sub-word drive line driver circuit.

11. The semiconductor memory device according to claim 1, wherein each of the plurality of bit line pairs has first and second bit lines,
   the pair of bit line kicker drive lines has first and second bit line kicker drive lines,
   the pair of bit line kicker has first and second bit line kickers,
   at least one driver includes first and second drivers,
   the first bit line kicker is connected between the first bit line and the first bit line kicker drive line,
   the second bit line kicker is connected between the second bit line and the second bit line kicker drive line,
   the first driver has an output node connected to the first bit line kicker drive line,
   the second driver has an output node connected to the second bit line kicker drive line,
   the second driver drives the second bit line kicker when the memory cell connected to the first bit line is accessed, and
   the first driver drives the first bit line kicker when the memory cell connected to the second bit line is accessed.

12. The semiconductor memory device according to claim 11, wherein either of the first or second drivers is activated with respect to one-time word line selection.

13. The semiconductor memory device according to claim 11, wherein the sub-cross region comprises first and second sub-cross regions arranged alternately in the column direction,
   the first driver is arranged in the first sub-cross regions arranged alternately in the column direction,
   the first driver is arranged in the first sub-cross region,
   the second driver is arranged in the second sub-cross region, and
   only onee of the first or second driver is selected with respect to one-time activation of the first control signal.

14. The semiconductor memory device according to claim 10, further comprising:
   a clamp circuit connected to the first and second bit line kicker drive lines, and fixing the first and second bit line kicker drive lines to a reset potential when the bit line kicker is non-selection and non-operation.

15. The semiconductor memory device according to claim 13, wherein the clamp circuit fixes one of the first and second bit line kickers to a reset potential when the other of first and second bit line kickers is operated.

16. The semiconductor memory device according to claim 15, wherein the clamp circuit is a pull-up circuit, which pulls up each potential of the first and second bit line kicker drive lines.

17. The semiconductor memory device according to claim 16, wherein the pull-up circuit includes first and second PMOS transistors, the first PMOS transistor has a source connected to a supply node having power supply potential, a drain connected to the first bit line kicker drive line, and a gate connected to the second bit line kicker drive line, the second PMOS transistor has a source connected to a supply node having power supply potential, a drain connected to the second bit line kicker drive line, and a gate connected to the first bit line kicker drive line.

18. The semiconductor memory device according to claim 14, wherein the clamp circuit is a pull-down circuit, which pulls down each potential of the first and second bit line kicker drive lines.

19. The semiconductor memory device according to claim 18, wherein the pull-up circuit includes first and second NMOS transistors, the first NMOS transistor has a source connected to a supply node having power supply potential, a drain connected to the first bit line kicker drive line, and a gate connected to the second bit line kicker drive line, the second NMOS transistor has a source connected to a supply node having power supply potential, a drain connected to the second bit line kicker drive line, and a gate connected to the first bit line kicker drive line.

20. The semiconductor memory device according to claim 1, wherein each of the pair of bit line kickers includes a capacitor element.

21. The semiconductor memory device according to claim 20, wherein the capacitor element is a MOS capacitor.

22. The semiconductor memory device according to claim 1, wherein at least one driver receives first and second power supply potentials.

23. The semiconductor memory device according to claim 22, wherein the first power supply potential is a step-up potential, and the second power supply potential is a negative potential.

24. The semiconductor memory device according to claim 22, wherein the first power supply potential is a step-up potential, and the second power supply potential is a ground potential.

25. The semiconductor memory device according to claim 22, wherein the first power supply potential is an internal power supply potential, and the second power supply potential is a ground potential.

26. The semiconductor memory device according to claim 22, wherein the first power supply potential is an internal power supply potential, and the second power supply potential is a negative potential.

* * * * *

UNITED STATES PATENT AND TRADEMARK OFFICE
CERTIFICATE OF CORRECTION

PATENT NO. : 6,906,979 B2
DATED : June 14, 2005
INVENTOR(S) : Tsuneo Inaba

It is certified that error appears in the above-identified patent and that said Letters Patent is hereby corrected as shown below:

Column 19,
Line 47, replace "line." with -- line, --.

Column 20,
Lines 47-48, remove "the first driver is arranged in the first sub-cross regions arranged alternatively in the column direction,".
Line 52, replace "onee" with -- one --.

Signed and Sealed this

Twenty-first Day of March, 2006

JON W. DUDAS
*Director of the United States Patent and Trademark Office*